(12) United States Patent
Mackey et al.

(10) Patent No.: US 8,189,339 B2
(45) Date of Patent: May 29, 2012

(54) FLEXIBLE CIRCUIT ASSEMBLY FOR A CAPACITIVE-SENSING DEVICE

(75) Inventors: Bob Lee Mackey, San Jose, CA (US); Khamvong Thammasouk, San Jose, CA (US)

(73) Assignee: Synaptics, Inc., Santa Clara, CA (US)

( * ) Notice: Subject to any disclaimer, the term of this patent is extended or adjusted under 35 U.S.C. 154(b) by 110 days.

(21) Appl. No.: 12/567,631

(22) Filed: Sep. 25, 2009

(65) Prior Publication Data
US 2011/0075382 A1 Mar. 31, 2011

(51) Int. Cl.
*H05K 1/00* (2006.01)
(52) U.S. Cl. ........................................ 361/749
(58) Field of Classification Search .............. 174/261, 174/254; 361/749–751
See application file for complete search history.

(56) References Cited

U.S. PATENT DOCUMENTS

| | | | |
|---|---|---|---|
| 4,028,509 A | 6/1977 | Zurcher | |
| 6,558,169 B2 * | 5/2003 | Figueroa et al. | 439/70 |
| 2002/0149572 A1 | 10/2002 | Schulz et al. | |
| 2007/0285406 A1 | 12/2007 | Kukulj et al. | |
| 2008/0158181 A1 | 7/2008 | Hamblin et al. | |
| 2010/0213958 A1 * | 8/2010 | Lin et al. | 324/755 |

* cited by examiner

*Primary Examiner* — Jeremy Norris
*Assistant Examiner* — Tremesha S Willis

(57) ABSTRACT

A flexible circuit assembly is provided which includes a flexible circuit, a substrate of a capacitive-sensing device and an electronic component that are coupled to the flexible circuit. The flexible circuit includes a first portion having a first conductive contact pad, a second portion having a second conductive contact pad, and a third portion disposed between the first portion and the second portion. The flexible circuit is configured to fold at the third portion between the first portion and the second portion so that the first conductive contact pad couples to a first conductor disposed along a first edge of the substrate and the second conductive contact pad couples to a second conductor disposed along a second edge of the substrate of the capacitive-sensing device. The first edge of the substrate of the capacitive-sensing device is non-parallel to the second edge of the substrate of the capacitive-sensing device.

20 Claims, 18 Drawing Sheets

US 8,189,339 B2

FLEXIBLE CIRCUIT ASSEMBLY FOR A CAPACITIVE-SENSING DEVICE

TECHNICAL FIELD

Embodiments of the present invention relate generally to the field of capacitive-sensing devices.

BACKGROUND

The rise of personal computer and telecommunications technology has led to various developments in the technology of human machine interfaces. Most notable among these has been the development of the graphical user interface (GUI), which allows the user to input data into a computer system simply by pointing and clicking with a pointing device such as a computer mouse. This has lead to the development of alternative technologies for pointing devices, for example, capacitive-sensing devices such as touchpads and touch screens, which are ubiquitously present as input devices for laptop computers and mobile phones.

Thus, with the growth of capacitive-sensing devices utilized as human machine interfaces, methods for increasing the size of the active, visible touch-space on the surface of the capacitive-sensing device have attracted continuing attention from the scientific and engineering community engaged in the field of human machine interfaces. However, interconnection assemblies attached at borders of a capacitive-sensing device can take up considerable space, which otherwise might be used to enhance the interactive experience of the user with the touchpad, or touch screen.

SUMMARY

Embodiments of the present invention include a flexible circuit assembly. The flexible circuit assembly includes a flexible circuit, a substrate of a capacitive-sensing device that is coupled to the flexible circuit, and an electronic component that is coupled to the flexible circuit. The flexible circuit includes a first portion having a first conductive contact pad, a second portion having a second conductive contact pad, and a third portion disposed between the first portion and the second portion. The flexible circuit is configured to fold at the third portion between the first portion and the second portion so that the first conductive contact pad couples to a first conductor disposed along a first edge of the substrate of the capacitive-sensing device and the second conductive contact pad couples to a second conductor disposed along a second edge of the substrate of the capacitive-sensing device. The first edge of the substrate of the capacitive-sensing device is non-parallel to the second edge of the substrate of the capacitive-sensing device.

DESCRIPTION OF THE DRAWINGS

The accompanying drawings, which are incorporated in and form a part of this specification, illustrate embodiments of the invention and, together with the description, serve to explain the embodiments of the invention.

The drawings referred to in this description should not be understood as being drawn to scale except if specifically noted.

DESCRIPTION OF EMBODIMENTS

Reference will now be made in detail to the various embodiments of the present invention. While the invention will be described in conjunction with alternative embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
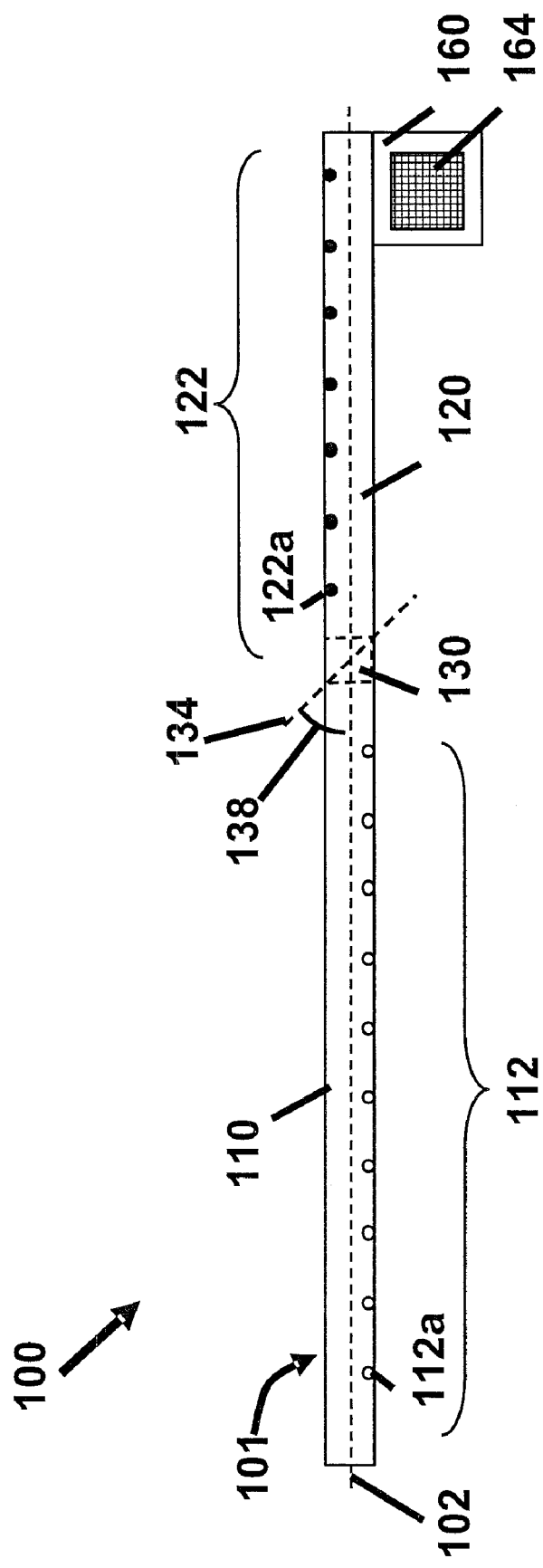
FIG. 1 is a plan view of a flexible circuit configured for coupling to a substrate of a capacitive-sensing device, and including a first portion, a second portion and a third portion such that the flexible circuit is configured to fold at the third portion between the first portion and the second portion, in accordance with embodiments of the present invention.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary. Description of Embodiments of the Present Invention for a Flexible Circuit Assembly for a Capacitive-Sensing Device With reference now to FIG. 1, in accordance with an embodiment of the present invention, a plan view 100 of a flexible circuit 101 configured for coupling to a substrate of a capacitive-sensing device is shown. The flexible circuit 101 includes a first portion 110, a second portion 120 and a third portion 130 such that the flexible circuit 101 is configured to fold at the third portion 130 between the first portion 110 and the second portion 120. The first portion 110 includes at least a first conductive contact pad 112a, and a first surface, as shown in FIG. 1 the front-facing surface of the figure. The first portion 110 also includes a second surface, as illustrated in FIG. 1 the back-facing surface of the figure. As discussed herein, a conductive contact pad disposed on the front-facing surface, which is the first surface, is shown as an open circle; and, a conductive contact pad disposed on the back-facing surface, which is the second surface, is shown as a filled circle. Thus, as shown in FIG. 1 and other figures or portions of figures showing various embodiments of a flexible circuit, features, for example, conductive contact pads, disposed on both the front-facing and back-facing surfaces of the flexible circuit are shown to facilitate the discussion. Although conductive contact pads are shown as having a circular shape, this is by way of example and not limitation thereto, as other shapes for the conductive contact pads are within the spirit and scope of embodiments of the present invention. Moreover, the first conductive contact pad 112a may be included in a first plurality 112 of conductive contact pads; and, the second conductive contact pad 122a may be included in a second plurality 122 of conductive contact pads. In embodiments of the present invention, a conductive contact pad, or alternatively pluralities of conductive contact pads, may be composed of copper; thus, a conductive contact pad may include an exposed and raised copper pad that is configured to couple with the substrate of a capacitive-sensing device. As described herein, embodiments of the present invention that include the capacitive-sensing device are by way of example and not limitation thereto, as embodiments of the present invention also include the genus of sensors of which the capacitive-sensing device is a species, as well as other species of sensors, as are subsequently described.

With further reference to FIG. 1, in accordance with an embodiment of the present invention, the second portion 120 includes at least a second conductive contact pad 122a, and a first surface such that the first surface of the first portion 110 and first surface of the second portion 120 face substantially in the same direction when the flexible circuit 101 is arranged in an unfolded configuration. The foldable portion, which is the third portion 130, is disposed between the first portion 110 and the second portion 120. The flexible circuit 101 is configured to be folded at the foldable portion, which is the third portion 130, such that, when the flexible circuit 101 is folded, the first surface of the first portion 110 and first surface of the second portion 120 face substantially in opposite directions, and the first conductive contact pad 112a couples to a first conductor disposed along an edge of a sensor substrate and the second conductive contact pad 122a couples to a second conductor disposed along an edge of an electronic device. In embodiments of the present invention, the first edge of the sensor substrate is non-parallel to the second edge of the electronic device. In one embodiment of the present invention, a sensor of the sensor substrate includes a capacitive-sensing device, by way of example without limitation thereto. In other embodiments of the present invention, the sensor may be a capacitive, resistive, optical, infrared, or acoustic sensor. Moreover, in an embodiment of the present invention, the sensor may be substantially transparent. In one embodiment of the present invention, the electronic device may include the capacitive-sensing device, by way of example without limitation thereto, as is subsequently described in the discussion of FIG. 2. In another embodiment of the present invention, a sensor of the sensor substrate includes a capacitive-sensing device and the electronic device may include a display (not shown), by way of example without limitation thereto. The flexible circuit also includes at least one routing trace (not shown) coupled to a conductive contact pad, for example, first conductive contact pad 112a, or second conductive contact pad 122a, which provides for electrical interconnections to the capacitive-sensing device and the electronic device. Moreover, the flexible circuit may include a plurality of routing traces (not shown) that includes the routing trace coupled to a conductive contact pad, for example, first conductive contact pad 112a, or second conductive contact pad 122a, or routing traces coupled to pluralities of conductive pads, for example, first plurality 112 of conductive contact pads, or second plurality 122 of conductive contact pads. In embodiments of the present invention, a routing trace, or alternatively, the plurality of routing traces, may be composed of a conductive metal such as but not limited to, copper or aluminum. The flexible circuit includes an electrically insulating substrate, for example, Kapton, polyimide or polyester, which provides mechanical support for the routing traces and conductive contact pads, as well as electrical isolation of the routing traces from one another.

With further reference to FIG. 1, in accordance with an embodiment of the present invention, the foldable portion, which is the third portion 130, includes a folding axis 134. In one embodiment of the present invention, the folding axis 134 is disposed at an angle 138 to a lengthwise axis 102 of the flexible circuit 101 in an unfolded configuration. In one embodiment of the present invention, the angle 138 may be 45° so that, upon folding the flexible circuit 101, a right angle is made between the first portion 110 and the second portion 120 for coupling to a sensor substrate having edges disposed at a right angle. Alternatively, in another embodiment of the present invention, the angle 138 may be other than 45° so that, upon folding the flexible circuit 101, an angle other than a right angle is made between the first portion 110 and the second portion 120 for coupling to a sensor substrate having edges disposed at other than a right angle. In another embodiment of the present invention, the second portion 120 of the flexible circuit 101 is a substantially rectilinear continuous extension of the first portion 110 of the flexible circuit 101, as indicated by the lengthwise axis 102. As used herein, the phrase, "a substantially rectilinear continuous extension," means that the main body of the flexible circuit 101 has a nominally tape-like shape, neglecting tabular extensions, or alternatively, fingers, that may extend from the long sides of the main body. For example, as shown in FIG. 1, the main body of the flexible circuit 101 includes the first portion 110, the second portion 120 and the third portion 130, but a tabular extension may be attached to a portion of the main body, for example, tabular extension 160, which may provide for attachment of an electronic component, or alternatively, for coupling with a tab of the sensor substrate, for example, a tab of the substrate of the capacitive-sensing device, as subsequently described in the discussion of FIGS. 6A, 6B and 6E through 6F. In one embodiment of the present invention, the flexible circuit may include fingers configured to couple to two sides of the sensor substrate along an edge of the sensor substrate.

With further reference to FIG. 1, in accordance with an embodiment of the present invention, the foldable portion, which is the third portion 130, is configured to allow a smaller border to be used for interconnecting the flexible circuit 101 at borders of a capacitive-sensing device and to increase the space provided for the active, visible touch-space on the surface of the capacitive-sensing device, which might be used to enhance the interactive experience of the user with a touchpad or touch screen. In accordance with embodiments of the present invention, the flexible circuit 101 including the foldable portion, which is the third portion 130, is configured to allow a smaller form factor and/or a larger touch area. A typical touch surface or touch-screen has some area which is visible by the user, and some additional area which is required for electrical and mechanical connections. It is often desired to have a smaller border, which is an unseen area, and the screen or surface to be larger. In accordance with embodiments of the present invention, the flexible circuit 101 eliminates the need to run traces along the periphery of the transparent sensor and provides a direct connection to the electrodes of the sensor, which may be a capacitive-sensing device. In another embodiment of the present invention, a process for manufacturing the flexible circuit 101 allows narrow traces to be made at no extra cost. Around the edge of the sensor there are several traces that run up the side, so the traces get squeezed as tightly as possible since there is often a desire for a smaller border and bigger viewing area. In accordance with embodiments of the present invention, the flexible circuit 101 is a way to make those borders narrower. For example, in the case of the polyethylene terephthalate (PET) sensors, there being 3 layers with electrical connections on them, just one may have the connections running up the side. Typical screen printed silver ink on PET has an individual trace width of 0.25 to 0.3 millimeters (mm). In accordance with embodiments of the present invention, narrower traces, 25 microns, for example, on flexible circuit 101, can be obtained, which can be fabricated upon order from a fabrication facility, already patterned. In one embodiment of the present invention, the flexible circuit 101 may be easily attached to the substrate of the sensor, which may be a capacitive-sensing device, by anisotropic conductive film (ACF), or alternatively, anisotropic conductive paste (ACP). In an embodiment of the present invention, bond pads at ends, or corners, of the edges of the sensor substrate may be used for bonding with ACF or ACP, which provide that the flexible circuit 101 does not snag or catch during the assembly process.

With further reference to FIG. 1, in accordance with another embodiment of the present invention, the flexible circuit 101 may include a plurality of fingers such that the plurality of fingers is configured to couple to two sides of a sensor substrate along one edge of the sensor substrate. In another embodiment of the present invention, the electronic component is a controller. The controller is coupled to the flexible circuit 101, for example, at tabular extension 160; the controller is coupled to the capacitive-sensing device with the flexible circuit 101 and is configured for providing control signals to the capacitive-sensing device. Alternatively, in other embodiments of the present invention, the electronic component may be selected from the group consisting of a resistor, a capacitor, an inductor, a connector, an active discrete electronic component, a light emitting diode and an application-specific integrated circuit (ASIC), by way of example and not limitation thereto. In another embodiment of the present invention, the flexible circuit 101 may further include a stiffener disposed at a location, for example, tabular extension 160, where an electronic component 164 couples to the flexible circuit 101; the stiffener provides a stiff mechanical support to facilitate mechanical attachment of the electronic component 164 to the flexible circuit 101.

Figure 2:
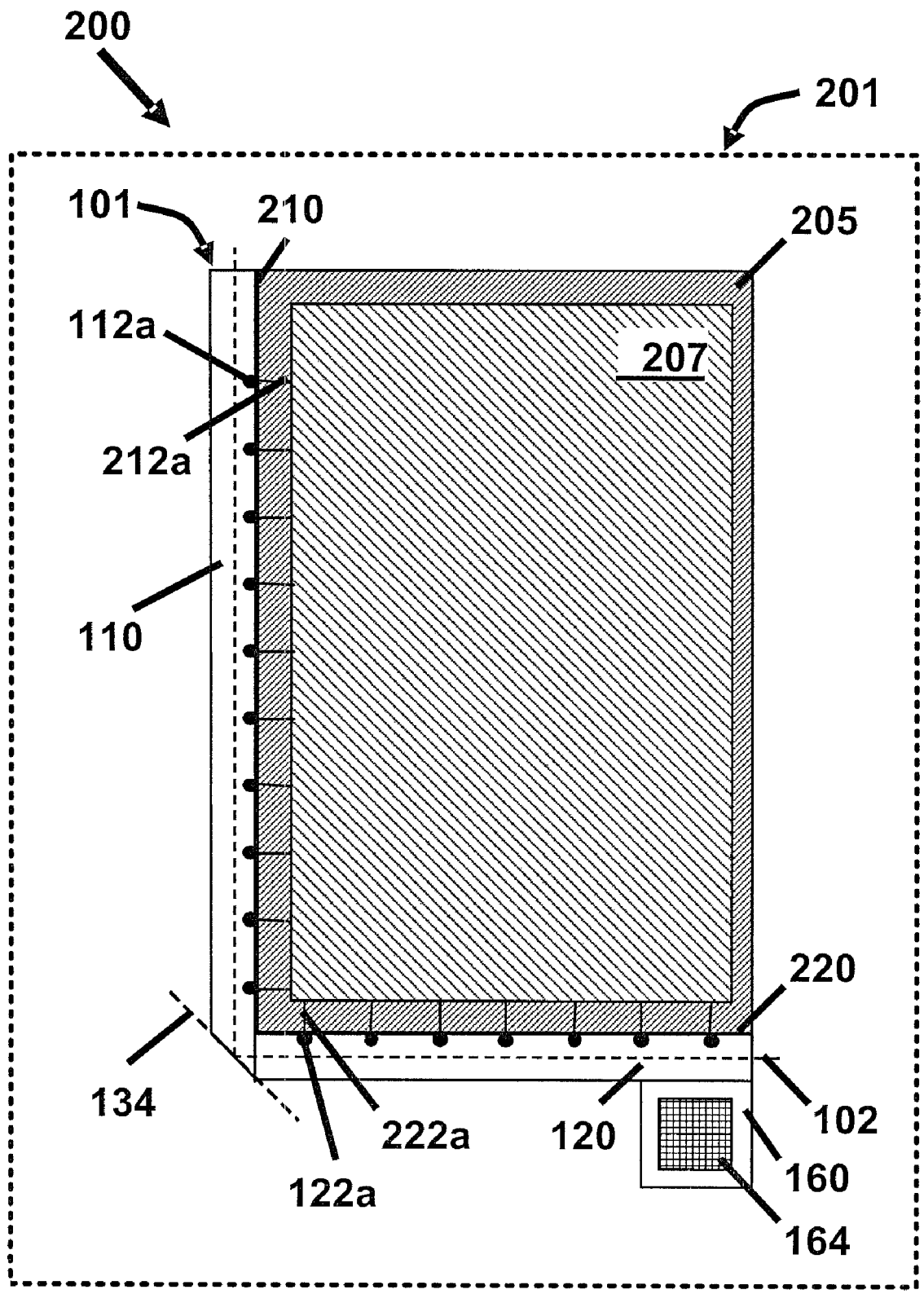
FIG. 2 is a plan view of a flexible circuit assembly including the flexible circuit of FIG. 1, a substrate of a capacitive-sensing device and an electronic component, such that the flexible circuit is coupled to the substrate of the capacitive-sensing device in which a first edge of the substrate is non-parallel to a second edge of the substrate, in accordance with embodiments of the present invention.

With reference now to FIG. 2 and further reference to FIG. 1, in accordance with embodiments of the present invention, a plan view 200 of a flexible circuit assembly 201 is shown that includes the flexible circuit 101 of FIG. 1, a substrate 205 of a capacitive-sensing device 207 and an electronic component 164. As described herein, embodiments of the present invention with respect to the flexible circuit 101 are included within the environment of the flexible circuit assembly 201 and are to be understood as being included within the flexible circuit assembly 201. The flexible circuit 101 is folded, at the folding axis 134, so as to couple to the substrate 205 of the capacitive-sensing device 207 in which a first edge 210 of the substrate 205 is non-parallel to a second edge 220 of the substrate 205. The flexible circuit assembly 201 includes the flexible circuit 101, the substrate 205 of the capacitive-sensing device 207 and the electronic component 164. The flexible circuit 101 includes the first portion 110 including a first conductive contact pad 112a, a second portion 120 including a second conductive contact pad 122a, and a third portion 130 disposed between the first portion 110 and the second portion 120. The substrate 205 of the capacitive-sensing device 207 is coupled to the flexible circuit 101. The electronic component 164 is coupled to the flexible circuit 101. The flexible circuit 101 is configured to fold at the third portion 130 between the first portion 110 and the second portion 120 so that the first conductive contact pad 112a couples to a first conductor 212a disposed along the first edge 210 of the substrate 205 of the capacitive-sensing device 207 and the second conductive contact pad 122a couples to a second conductor 222a disposed along the second edge 220 of the substrate 205 of the capacitive-sensing device 207. In embodiments of the present invention, the first edge 210 of the substrate 205 of the capacitive-sensing device 207 is non-parallel to the second edge 220 of the substrate 205 of the capacitive-sensing device 207. In one embodiment of the present invention, to prevent the flexible circuit from unfolding once the flexible circuit is coupled to the substrate 205, the flexible circuit may include an adhesive disposed at the third portion 130 such that a first surface of the first portion 110 is adhered to a first surface of the second portion 120 with the flexible circuit 101 configured in a folded configuration. In another embodiment of the present invention, the flexible circuit 101 may include an adhesive disposed at the third portion 130 such that a second surface of the first portion 110 is adhered to a second surface of the second portion 120 with the flexible circuit 101 configured in a folded configuration. In other embodiments of the present invention, the flexible circuit 101 may have an adhesion area (not shown) for physically attaching to the substrate 205 of the capacitive-sensing device 207; the adhesion areas may include areas with an exposed conductor configured to align with an exposed conductor on the substrate 205 of the capacitive-sensing device 207. For example, in one embodiment of the present invention, the flexible circuit 101 may include extra conductive contact pads to attach to sensor substrate in a way as to reduce the likelihood of detachment or disconnection during assembly of the flexible circuit assembly 201.

With further reference to FIGS. 1 and 2, in accordance with one embodiment of the present invention, the first portion includes a second surface and the second portion includes a second surface such that the first conductive contact pad 112a and the second conductive contact pad 122a are disposed on opposite facing surfaces of the first portion 110 and the second portion 120 when the flexible circuit 101 is arranged in an unfolded configuration, as indicated by the open circle of first conductive contact pad 112a and the closed circle of the second conductive pad 122a as previously described, by way of example without limitation thereto. However, in another embodiment of the present invention, the first conductive contact pad 112a may be disposed on the first surface of the first portion 110 and the second conductive contact pad 122a may be disposed on the first surface of the second portion 120, which would be shown in FIG. 1 as both the first and second conductive contact pads 112a and 122a appearing as open circles, or alternatively, if the conductive contact pads 112a and 122a are disposed on second surfaces, as closed circles.

Figure 3A:
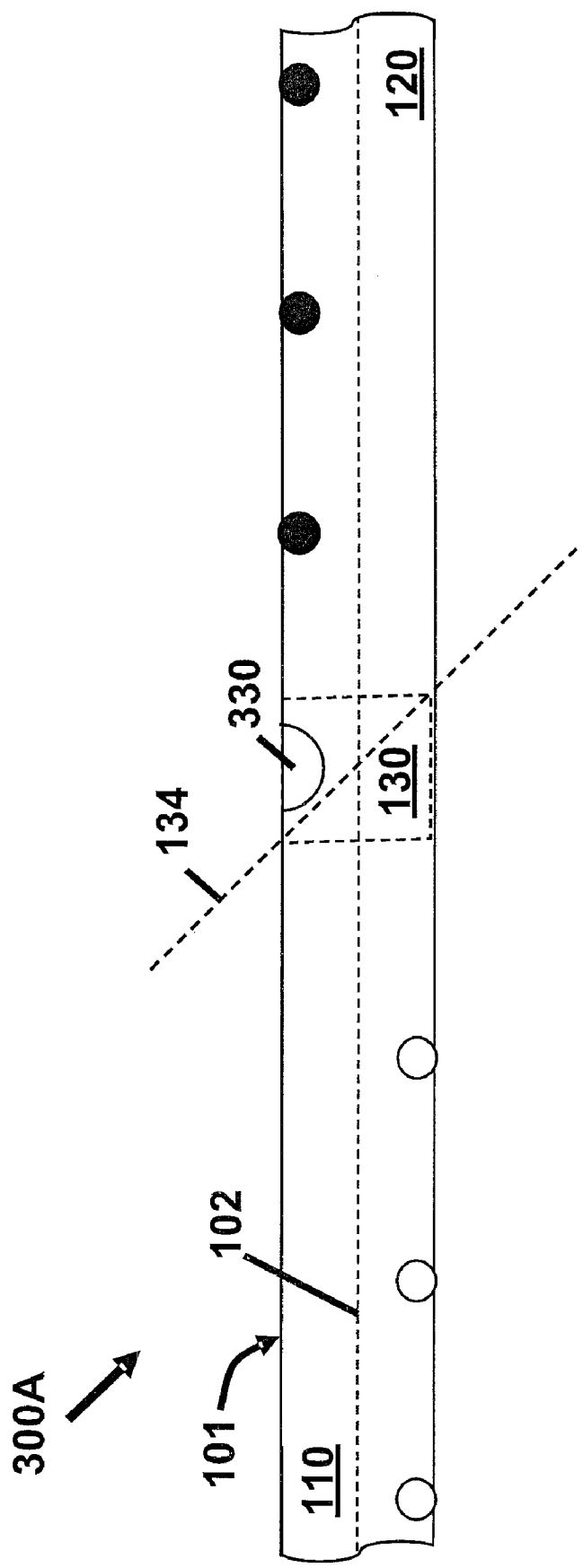
FIG. 3A is a plan view of a portion of the flexible circuit of FIG. 1 illustrating a fold-facilitation feature disposed at the third portion such that the fold-facilitation feature is at least one indentation, in accordance with embodiments of the present invention.
Figure 3B:
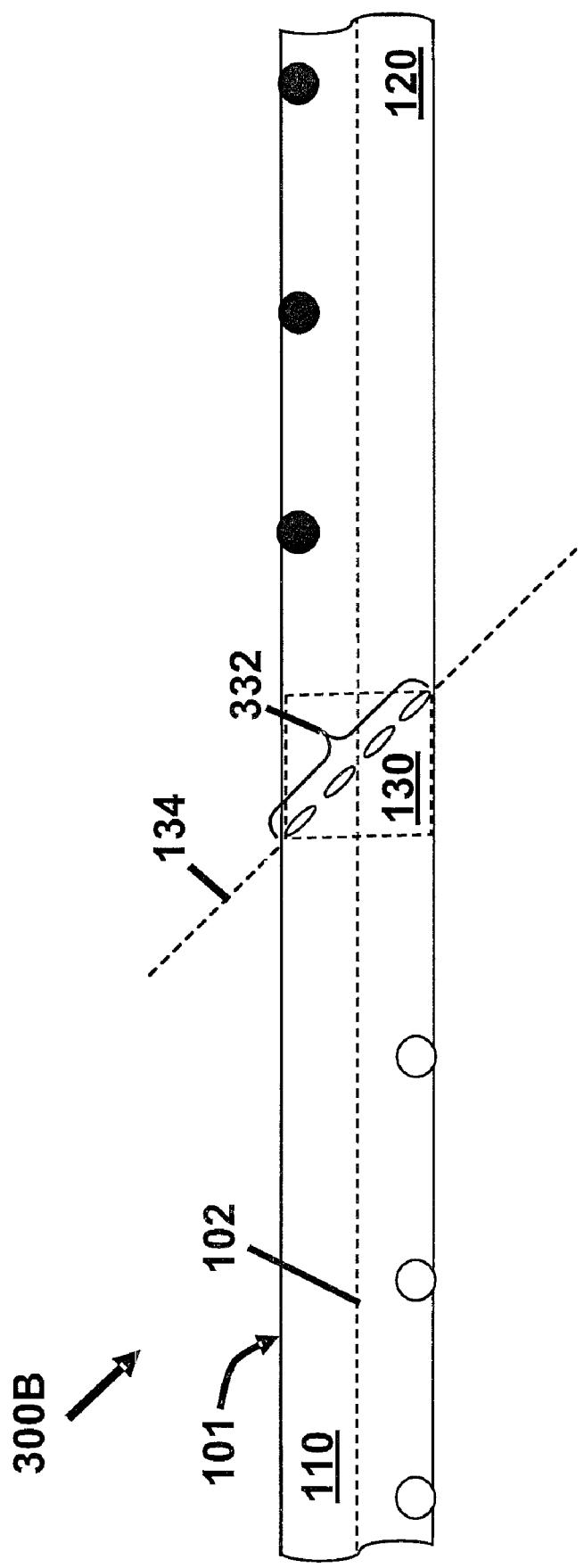
FIG. 3B is a plan view of a portion of the flexible circuit of FIG. 1 illustrating a fold-facilitation feature disposed at the third portion such that the fold-facilitation feature is a pattern of perforations, in accordance with embodiments of the present invention.
Figure 3C:
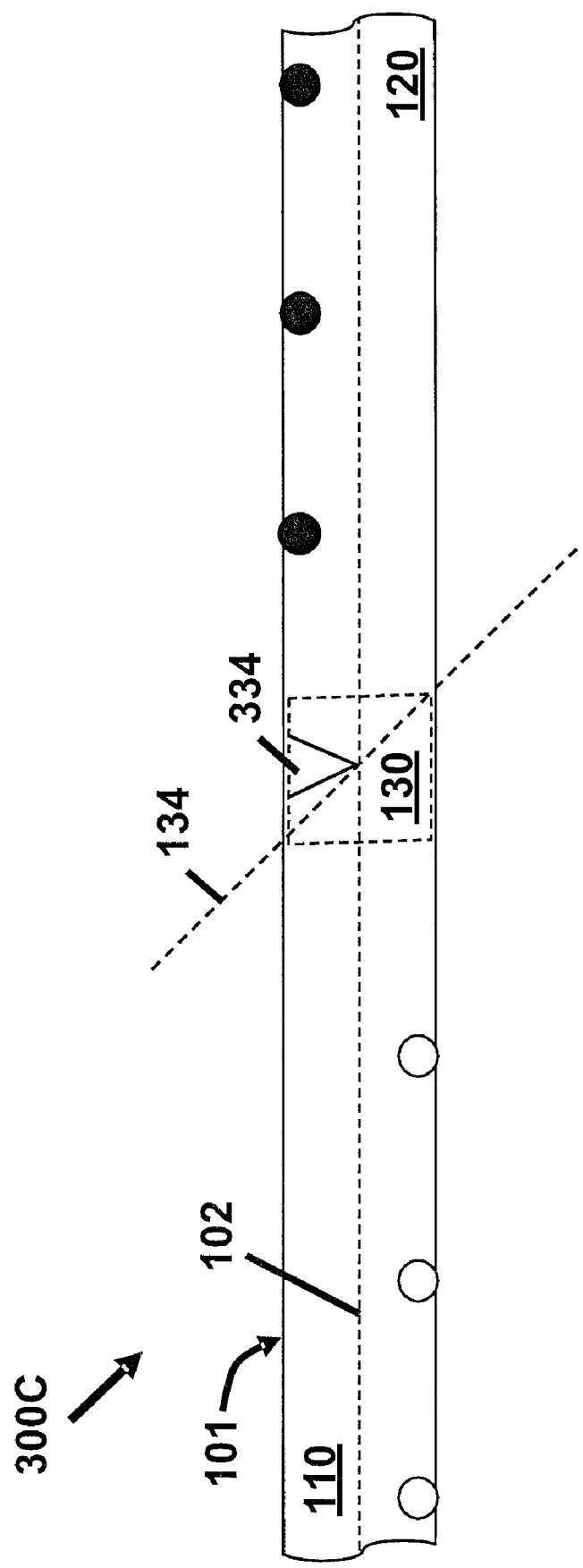
FIG. 3C is a plan view of a portion of the flexible circuit of FIG. 1 illustrating a fold-facilitation feature disposed at the third portion such that the fold-facilitation feature is at least one notch, in accordance with embodiments of the present invention.
Figure 3D:
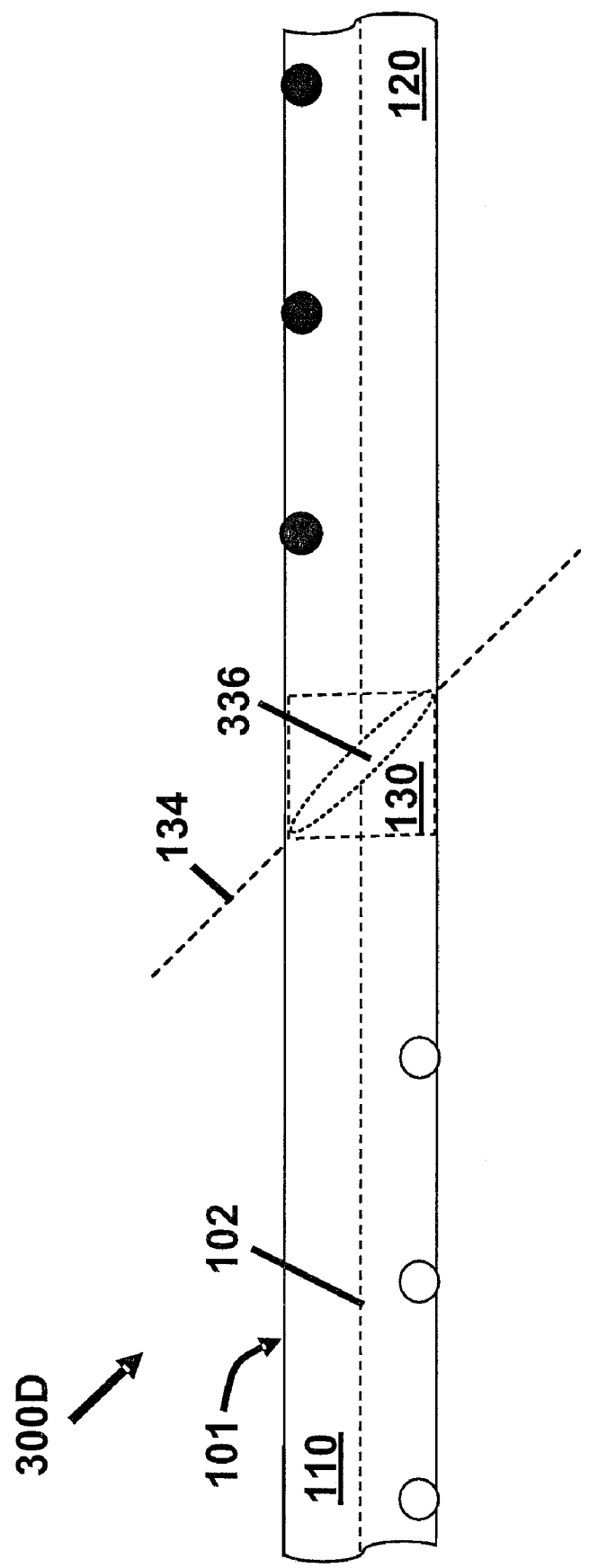
FIG. 3D is a plan view of a portion of the flexible circuit of FIG. 1 illustrating a fold-facilitation feature disposed at the third portion such that the fold-facilitation feature is an area of lower modulus, or alternatively, an area of thinner material, in accordance with embodiments of the present invention.
Figure 3E:
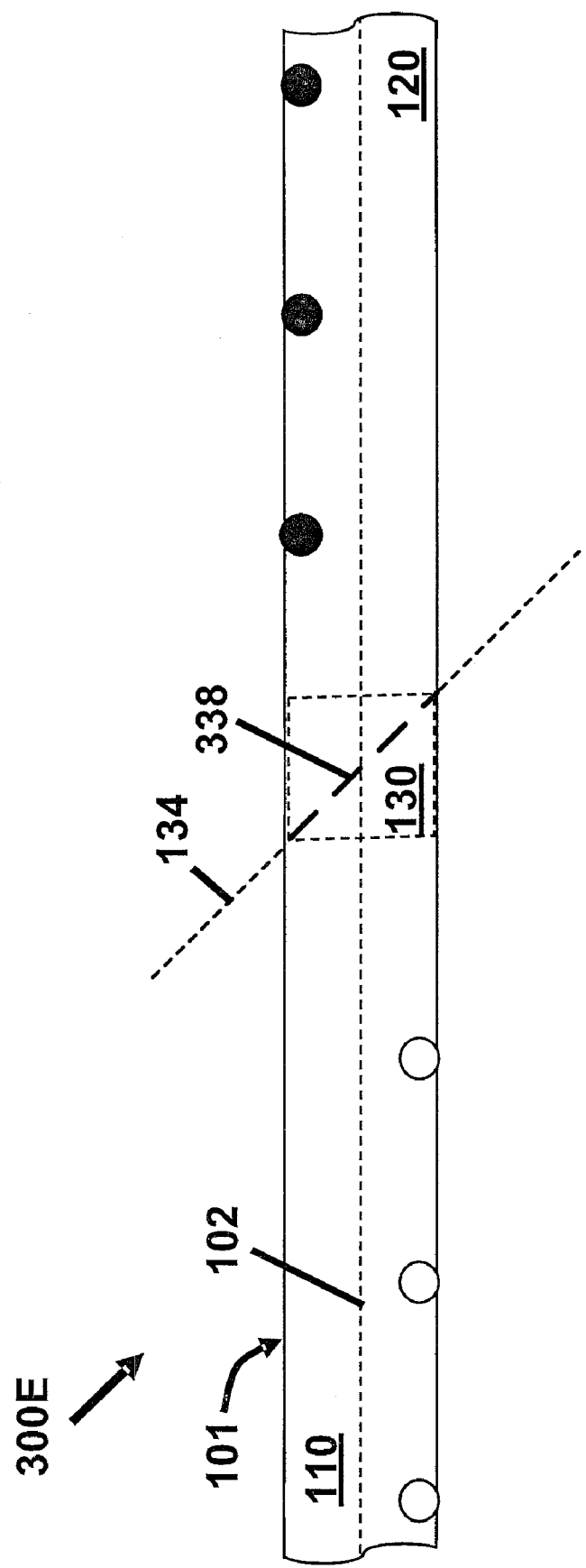
FIG. 3E is a plan view of a portion of the flexible circuit of FIG. 1 illustrating a fold-facilitation feature disposed at the third portion such that the fold-facilitation feature is a mark designating the third portion as a location for folding, in accordance with embodiments of the present invention.

With reference now to FIGS. 3A through 3E, in accordance with embodiments of the present invention, plan views 300A-300E of a portion of the flexible circuit 101 of FIG. 1 are shown that illustrate various fold-facilitation features 330, 332, 334, 336 and 338, respectively, disposed at the third portion 130. In accordance with embodiments of the present invention, the flexible circuit 101 may include a fold-facilitation feature disposed at the third portion 130 such that fold-facilitation feature is selected from the group, by way of example without limitation thereto, consisting of at least one indentation 330, a pattern of perforations 332, at least one notch 334, an area 336 of lower modulus, an area 336 of thinner material and a mark 338 designating the third portion 130 as a location for folding. As shown in FIGS. 3A-3E, the portion of the flexible circuit 101 includes a portion of the first portion 110, a portion of the second portion 120 and the third portion 130. Also, shown in FIGS. 3A-3E, is a portion of the lengthwise axis 102, the folding axis 134, and portions of the first and second pluralities of conductive contact pads, as indicated by the open and filled circles, respectively. In accordance with one embodiment of the present invention, a plan view 300A of a portion of the flexible circuit 101 of FIG. 1 is shown in FIG. 3A that illustrates a fold-facilitation feature that includes at least one indentation 330. In accordance with another embodiment of the present invention, a plan view 300B of a portion of the flexible circuit 101 of FIG. 1 is shown in FIG. 3B that illustrates a fold-facilitation feature that includes the pattern of perforations 332. In accordance with another embodiment of the present invention, a plan view 300C of a portion of the flexible circuit 101 of FIG. 1 is shown in FIG. 3C that illustrates a fold-facilitation feature that includes at least one notch 334. In accordance with another embodiment of the present invention, a plan view 300D of a portion of the flexible circuit 101 of FIG. 1 is shown in FIG. 3D that illustrates a fold-facilitation feature that includes an area 336 of lower modulus, or alternatively, an area 336 of thinner material. In accordance with another embodiment of the present invention, a plan view 300E of a portion of the flexible circuit 101 of FIG. 1 is shown in FIG. 3E that illustrates a fold-facilitation feature that includes the mark 338 designating the third portion 130 as a location for folding. In another embodiment of the present invention, the mark 338 includes a dashed line along the folding axis 134, by way of example without limitation thereto. In another embodiment of the present invention, an edge of the substrate may be beveled to facilitate folding of the flexible circuit 101 at a corner of the substrate such that the beveled corner (not shown) of the substrate registers with the folding axis 134 and accepts the flexible circuit 101 upon folding the flexible circuit 101; the beveled corner would facilitate bonding to conductors disposed on opposite sides of the substrate such that along one edge the conductors are disposed on one side of the substrate and along the other edge, which meets at the beveled corner, the conductors are disposed on the opposite side of the substrate. Similar fold facilitation features to the fold facilitation features 330, 332, 334, 336 and 338, described above, that may be disposed at the third portion 130 may also be disposed at a fifth portion, or other foldable portions, of a flexible circuit having more than one foldable portion. A flexible circuit having more than one foldable portion is next described.

Figure 4:
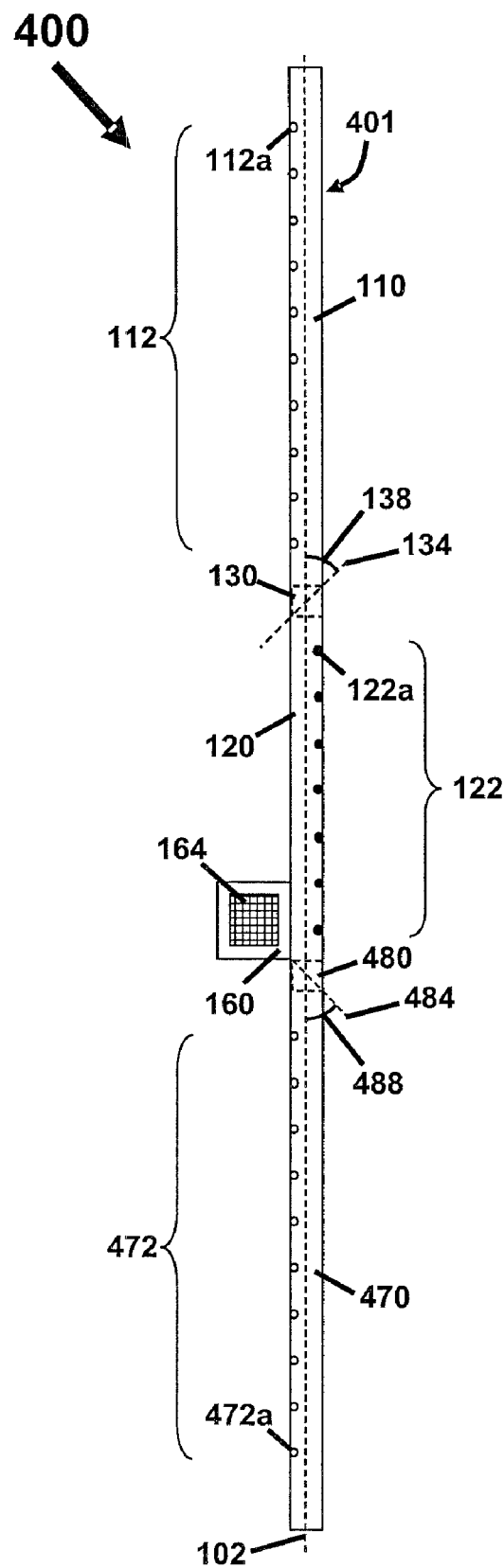
FIG. 4 is a plan view of a flexible circuit configured for coupling to a substrate of a capacitive-sensing device, and including a first portion, a second portion, a third portion, a fourth portion and a fifth portion such that the flexible circuit is configured to fold at the third portion between the first portion and the second portion and at the fifth portion between the second portion and the fourth portion, in accordance with embodiments of the present invention.

With reference now to FIG. 4, in accordance with embodiments of the present invention, a plan view 400 of a flexible circuit 401 is shown. The flexible circuit 401 is configured for coupling to a substrate of a capacitive-sensing device, and includes a first portion 110, a second portion 120, a third portion 130, a fourth portion 470 and a fifth portion 480. The flexible circuit 401 is configured to fold at the third portion 130 between the first portion 110 and the second portion 120 and at the fifth portion 480 between the second portion 120 and the fourth portion 470. The first portion 110 includes at least a first conductive contact pad 112a, and a first surface, as shown in FIG. 4 the front-facing surface of the figure. The first portion 110 also includes a second surface, as illustrated in FIG. 4 the back-facing surface of the figure. The first conductive contact pad 112a may be included in a first plurality 112 of conductive contact pads; and, the second conductive contact pad 122a may be included in a second plurality 122 of conductive contact pads.

With further reference to FIG. 4, in accordance with an embodiment of the present invention, the second portion 120 includes at least a second conductive contact pad 122a, and a first surface such that the first surface of the first portion 110 and first surface of the second portion 120 face substantially in the same direction when the flexible circuit 401 is arranged in an unfolded configuration. The fourth portion 470 includes at least a third conductive contact pad 472a, and a first surface such that the first surface of the second portion 120 and first surface of the fourth portion 470 face substantially in the same direction when the flexible circuit 401 is arranged in an unfolded configuration. One foldable portion, which is the third portion 130, is disposed between the first portion 110 and the second portion 120. Another foldable portion, which is the fifth portion 480, is disposed between the second portion 120 and the fourth portion 470. The flexible circuit 401 is configured to be folded at both foldable portions, which are the third and fifth portions 130 and 480, such that, when the flexible circuit 401 is folded at both foldable portions, the first surface of the first portion 110 and first surface of the second portion 120 face substantially in opposite directions, and the first surface of the second portion 120 and first surface of the fourth portion 470 face substantially in opposite directions. When the flexible circuit 401 is folded at both foldable portions, the first conductive contact pad 112a is configured to couple to a first conductor disposed along an edge of the sensor substrate, the second conductive contact pad 122a is configured to couple to a second conductor disposed along a second edge of the sensor substrate, and the third conductive contact pad 472a is configured to couple to a third conductor disposed along a third edge of the sensor substrate. In embodiments of the present invention, the first edge of the sensor substrate is non-parallel to the second edge of the sensor substrate; and, the second edge of the sensor substrate is non-parallel to the third edge of the sensor substrate. In one embodiment of the present invention, a sensor of the sensor substrate includes a capacitive-sensing device, as is subsequently described in the discussion of FIG. 5. The flexible circuit also includes at least one routing trace (not shown) coupled to a conductive contact pad, for example, first conductive contact pad 112a, the second conductive contact pad 122a, or the third conductive contact pad 472a, which provides for electrical interconnections to the capacitive-sensing device. Moreover, the flexible circuit may include a plurality of routing traces (not shown) that includes the routing trace coupled to a conductive contact pad, for example, first conductive contact pad 112a, the second conductive contact pad 122a, or the third conductive contact pad 472a, or routing traces coupled to pluralities of conductive pads, for example, first plurality 112 of conductive contact pads, second plurality 122 of conductive contact pads, or third plurality 472 of conductive contact pads.

With further reference to FIG. 4, in accordance with an embodiment of the present invention, one foldable portion, which is the third portion 130, includes a folding axis 134; and, another foldable portion, which is the fifth portion 480, includes a folding axis 484. In one embodiment of the present invention, the folding axis 134 is disposed at an angle 138 to the lengthwise axis 102 of the flexible circuit 401 in an unfolded configuration; and similarly, the folding axis 484 is disposed at an angle 488 to the lengthwise axis 102 of the flexible circuit 401 in an unfolded configuration. In one embodiment of the present invention, the angles 138 and 488 may be 45° so that, upon folding the flexible circuit 401, a right angle is made between the first portion 110 and the second portion 120 for coupling to a sensor substrate having first and second edges disposed at a right angle, and a right angle is made between the second portion 120 and the fourth portion 470 for coupling to a sensor substrate having second and third edges disposed at a right angle. Alternatively, in another embodiment of the present invention, the angles 138 and 488 may be other than 45° so that, upon folding the flexible circuit 401, an angle other than a right angle is made between the first portion 110 and the second portion 120 for coupling to a sensor substrate having first and second edges disposed at other than a right angle, and another angle other than a right angle is made between the second portion 120 and the fourth portion 470 for coupling to a sensor substrate having second and third edges disposed at other than a right angle. In another embodiment of the present invention, the second portion 120 of the flexible circuit 401 is a substantially rectilinear continuous extension of the first portion 110 of the flexible circuit 401; and, the fourth portion 470 of the flexible circuit 401 is a substantially rectilinear continuous extension of the second portion 120 of the flexible circuit 401, as indicated by the lengthwise axis 102. As shown in FIG. 4, the main body of the flexible circuit 401 includes the first portion 110, the second portion 120, the third portion 130, the fourth portion 470 and the fifth portion 480, but a tabular extension may be attached to a portion of the main body, for example, tabular extension 160, which may provide for attachment of an electronic component, or alternatively, for coupling with a tab of the sensor substrate, for example, a tab of the substrate of the capacitive-sensing device, as subsequently described in the discussion of FIGS. 6A, 6B and 6E through 6F.

With further reference to FIG. 4, in accordance with another embodiment of the present invention, the flexible circuit may include a plurality of fingers such that the plurality of fingers is configured to couple to two sides of a sensor substrate along one edge of the sensor substrate. In one embodiment of the present invention, the electronic component is a controller. The controller is coupled to the flexible circuit 401, for example, at tabular extension 160; the controller is coupled to the capacitive-sensing device with the flexible circuit 401 and is configured for providing control signals to the capacitive-sensing device. Alternatively, in other embodiments of the present invention, the electronic component may be selected from the group consisting of a resistor, a capacitor, an inductor, a connector, an active discrete electronic component, a light emitting diode and an application-specific integrated circuit (ASIC), by way of example and not limitation thereto. In another embodiment of the present invention, the flexible circuit 401 may further include a stiffener disposed at a location, for example, tabular extension 160, where the electronic component 164 couples to the flexible circuit 401; the stiffener provides a stiff mechanical support to facilitate mechanical attachment of the electronic component 164 to the flexible circuit 401.

Figure 5:
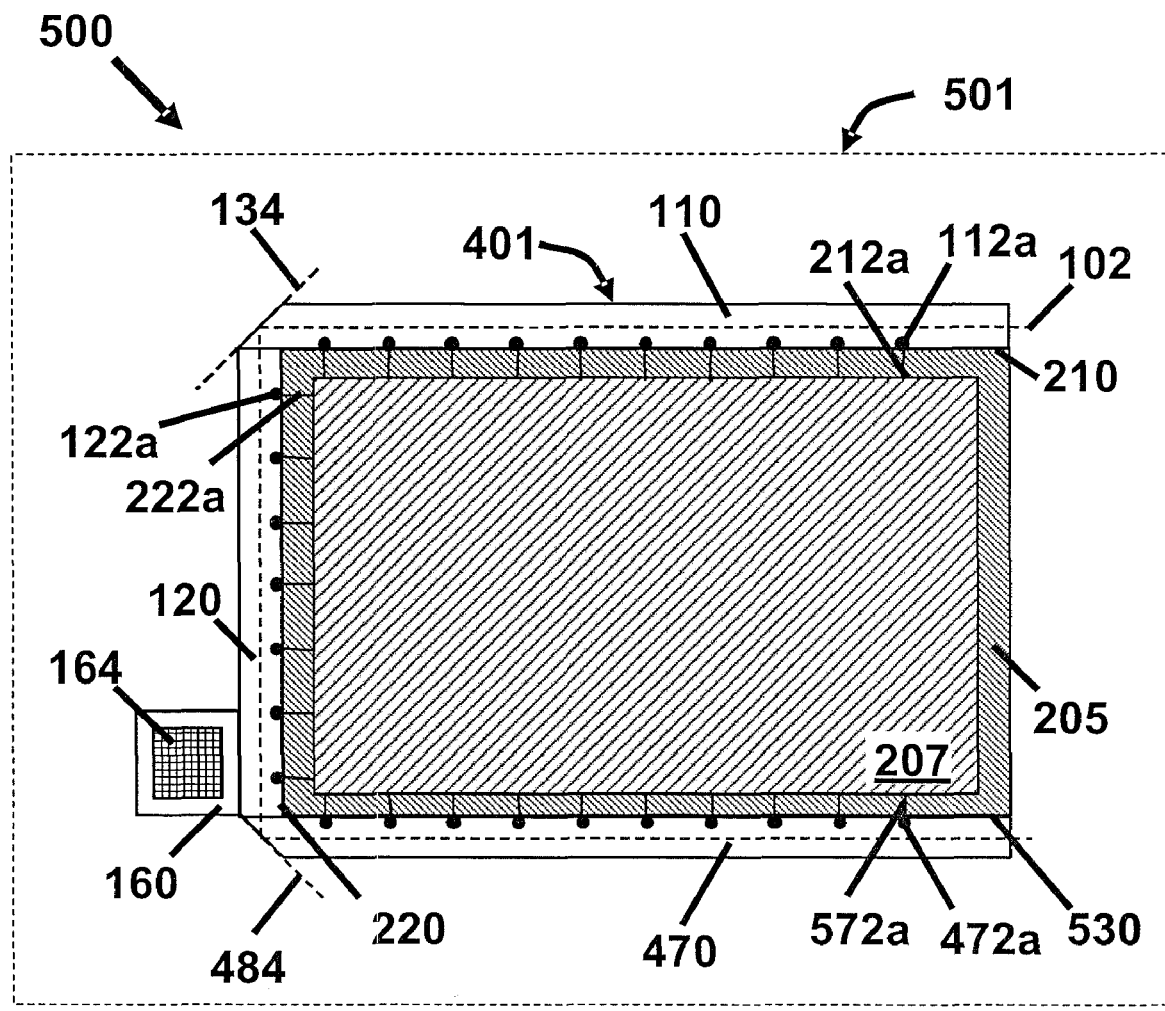
FIG. 5 is a plan view of a flexible circuit assembly including the flexible circuit of FIG. 4, a substrate of a capacitive-sensing device and an electronic component, such that the flexible circuit is coupled to the substrate of the capacitive-sensing device in which a first edge of the substrate is non-parallel to a second edge of the substrate and the second edge of the substrate is non-parallel to a third edge of the substrate, in accordance with embodiments of the present invention.

With reference now to FIG. 5 and further reference to FIG. 4, in accordance with embodiments of the present invention, a plan view 500 of a flexible circuit assembly 501 is shown that includes the flexible circuit 401 of FIG. 4, a substrate 205 of a capacitive-sensing device 207 and an electronic component 164. As described herein, embodiments of the present invention with respect to the flexible circuit 401 are included within the environment of the flexible circuit assembly 501 and are to be understood as being included within the flexible circuit assembly 501. The flexible circuit 401 is folded, at the folding axes 134 and 484, so as to couple to the substrate 205 of the capacitive-sensing device 207 in which a first edge 210 of the substrate 205 is non-parallel to a second edge 220 of the substrate 205, and in which the second edge 220 of the substrate 205 is non-parallel to a third edge 530 of the substrate 205. The flexible circuit assembly 501 includes the flexible circuit 401, the substrate 205 of the capacitive-sensing device 207 and the electronic component 164. The flexible circuit 401 includes the first portion 110 including the first conductive contact pad 112a, the second portion 120 including the second conductive contact pad 122a, the third portion 130 disposed between the first portion 110 and the second portion 120, the fourth portion 470 including the third conductive contact pad 472a and the fifth portion 480 disposed between the second portion 120 and the fourth portion 470. The substrate 205 of the capacitive-sensing device 207 is coupled to the flexible circuit 401. The electronic component 164 is coupled to the flexible circuit 401. The flexible circuit 401 is configured to fold at the third portion 130 between the first portion 110 and the second portion 120 so that the first conductive contact pad 112a couples to a first conductor 212a disposed along the first edge 210 of the substrate 205 of the capacitive-sensing device 207 and the second conductive contact pad 122a couples to a second conductor 222a disposed along the second edge 220 of the substrate 205 of the capacitive-sensing device 207. The flexible circuit 401 is also configured to fold at the fifth portion 480 between the second portion 120 and the fourth portion 470 so that the third conductive contact pad 472a couples to a third conductor 572a disposed along a third edge 530 of the substrate 205 of the capacitive-sensing device 207. In embodiments of the present invention, the first edge 210 of the substrate 205 of the capacitive-sensing device 207 is non-parallel to the second edge 220 of the substrate 205 of the capacitive-sensing device 207; and, the second edge 220 of the substrate 205 of the capacitive-sensing device 207 is non-parallel to the third edge 530 of the substrate 205 of the capacitive-sensing device 207. In one embodiment of the present invention, to prevent the flexible circuit from unfolding once the flexible circuit is coupled to the substrate 205, the flexible circuit may include an adhesive disposed at the third portion 130 and at the fifth portion 480 such that a first surface of the first portion 110 is adhered to a first surface of the second portion 120 and a first surface of the second portion 120 is adhered to a first surface of the fourth portion 470 with the flexible circuit 401 configured in a folded configuration. In another embodiment of the present invention, the flexible circuit 401 may include an adhesive disposed at the third portion 130 and at the fifth portion 480 such that a second surface of the first portion 110 is adhered to a second surface of the second portion 120 and a second surface of the second portion 120 is adhered to a second surface of the fourth portion 470 with the flexible circuit 401 configured in a folded configuration.

With further reference to FIGS. 4 and 5, in accordance with one embodiment of the present invention, the first portion 110 includes a second surface, the second portion 120 includes a second surface, and the fourth portion 470 includes a second surface such that the first conductive contact pad 112a and the second conductive contact pad 122a are disposed on opposite facing surfaces of the first portion 110 and the second portion 120, and the second conductive contact pad 122a and the third conductive pad 472a are disposed on opposite facing surfaces of the second portion 120 and the fourth portion 470 when the flexible circuit 401 is arranged in an unfolded configuration, as indicated by the open circles of first and third conductive contact pads 112a and 472a and the closed circle of the second conductive contact pad 122a, by way of example without limitation thereto. However, in another embodiment of the present invention, the first conductive contact pad 112a may be disposed on the first surface of the first portion 110, the second conductive contact pad 122a pad may be disposed on the first surface of the second portion 120, and the third conductive contact pad 472a pad may be disposed on the first surface of the fourth portion 470, which would be shown in FIG. 4 as all the conductive contact pads 112a, 122a and 472a appearing as open circles, or alternatively, if the conductive contact pads 112a, 122a and 472a are disposed on second surfaces, as closed circles, by way of example without limitation thereto. In other embodiments of the present invention, other permutations of orientations, with respect to the first and second surfaces, of the conductive contact pads 112a, 122a and 472a, the pluralities 112, 122 and 472 of conductive contact pads, as well as the conductive contact pads within the pluralities 112, 122 and 472 of conductive contact pads, are possible being within the spirit and scope of embodiments of the present invention.

Figure 6A:
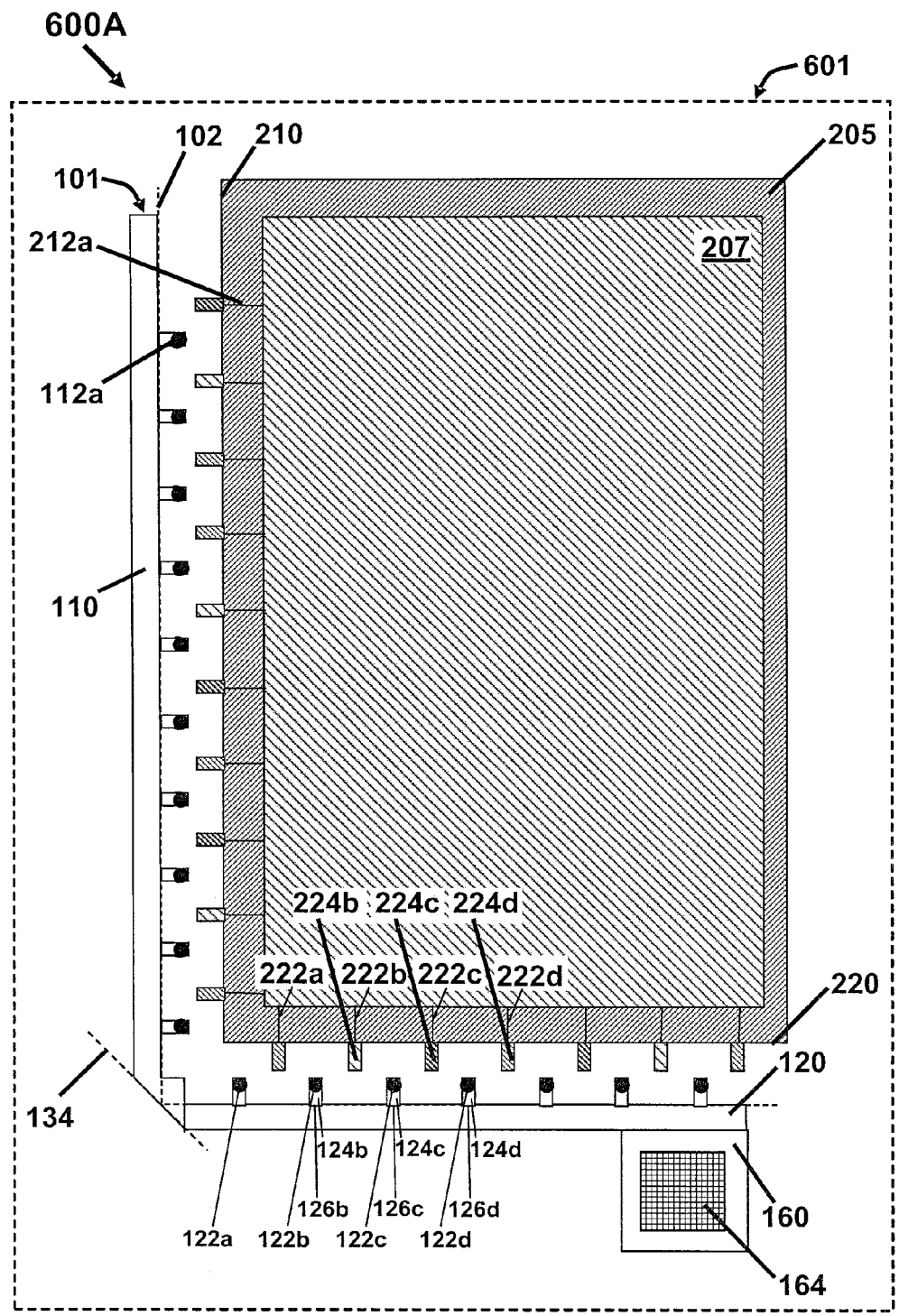
FIG. 6A is an exploded view of a flexible circuit, similar to the flexible circuit of FIG. 1, and a substrate of the capacitive-sensing device, similar to the substrate of FIG. 2, and strain-relief structures configured to accommodate coupling to and to conform to tabs of the substrate of the capacitive-sensing device, in accordance with embodiments of the present invention.

With reference now to FIG. 6A, in accordance with embodiments of the present invention, an exploded view 600A of a flexible circuit assembly 601 and a substrate 205 of the capacitive-sensing device 207 are shown. Also, depicted in FIG. 6A the flexible circuit 101 of the flexible circuit assembly 601 includes strain-relief structures, for example, crinkles 126b, 126c and 126d, configured to accommodate coupling to and to conform to tabs, for example, tabs 224b, 224c and 224d, of the substrate 205 of the capacitive-sensing device 207. As shown in FIGS. 6A-6H, components having the same reference numerals as components shown in FIGS. 1 and 2 provide the same function as previously described in the discussion of FIGS. 1 and 2 so that the embodiments of the present invention described in the discussion of FIGS. 1 and 2 are included in embodiments of the present invention described in the discussion of FIGS. 6A-6H. However, as shown in FIG. 6A, in an embodiment of the present invention, the flexible circuit 101 further includes at least one tabular extension, for example, one of tabular extensions 124b, 124c and 124d, such that the tabular extension is configured for coupling with a portion, for example, tabs 224b, 224c and 224d, of the substrate 205 of the capacitive-sensing device 207. Moreover, as shown in FIG. 6A, in an embodiment of the present invention, the flexible circuit 101 further includes at least one strain-relief structure, for example, crinkles 126b, 126c and 126d. Strain-relief structures include crinkles, of which crinkle 126b is an example, that are disposed at the base of the tabular extensions, of which tabular extension 124b is an example. At the ends of the tabular extensions, for example, the tabular extensions 124b, 124c and 124d, conductive contact pads, for example, conductive contact pads 122b, 122c and 122d, are disposed to couple to the substrate 205 of the capacitive-sensing device 207. In an embodiment of the present invention, a strain-relief structure, for example, one of crinkles 126b, 126c and 126d, is configured to accommodate coupling to and to conform to a tab, for example, one of tabs 224b, 224c and 224d, respectively, of the substrate 205 of the capacitive-sensing device 207.

With further reference to FIG. 6A, in accordance with embodiments of the present invention, the substrate 205 of the capacitive-sensing device 207 includes a laminated structure of electrically conductive layers separated by electrically insulating layers. An electrically conductive layer may include indium tin oxide (ITO); and, an electrically insulating layer may include PET. A typical substrate may have as many as three different levels of conductive layers that are patterned to provide the conductors, for example, conductors 222b, 222c and 222d, of the substrate 205. The conductors, for example, conductors 222b, 222c and 222d, may be brought out at an edge, for example, second edge 220, of the substrate 205 in the form of tabs, for example, tabs 224b, 224c and 224d, respectively. As shown in FIGS. 6A, 6C, and 6E-6H, tabs at each of three different levels are shown with different cross-hatching: tabs with the cross-hatching of tab 224d are at the lowest level relative to the top surface of the substrate 205; tabs with the cross-hatching of tab 224c are at the middle level relative to the top surface of the substrate 205; and, tabs with the cross-hatching of tab 224b are at the highest level relative to, or nearest to, the top surface of the substrate 205. The crinkles 126b, 126c and 126d at the bases of the tabular extensions 124b, 124c and 124d provide an offset of the tabular extension from the plane of the flexible circuit 101 so as to minimize strain in coupling the conductive contact pads 122b, 122c and 122d to the tabs 224b, 224c and 224d of the substrate 205.

Figure 6B:
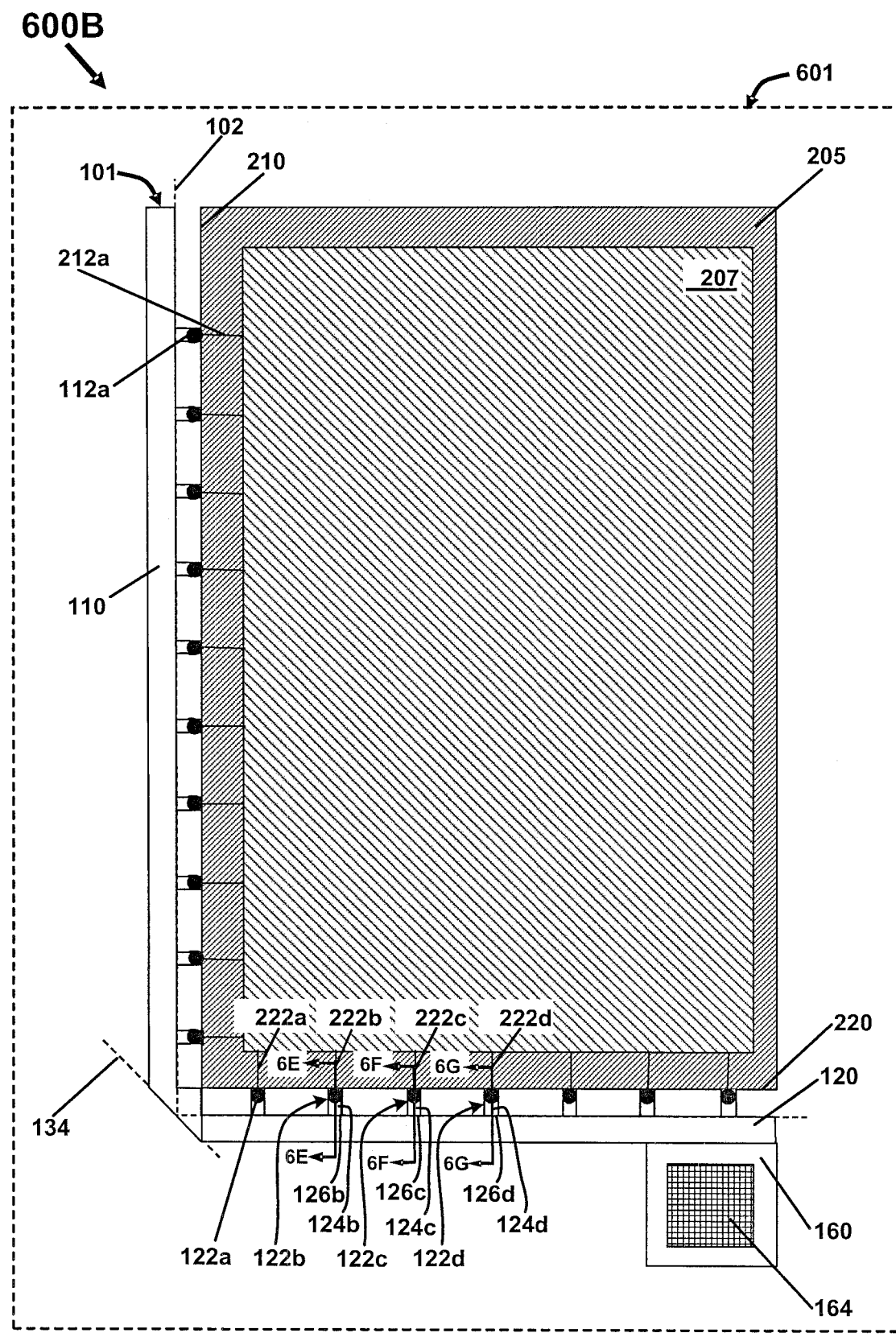
FIG. 6B is a plan view of an assembled flexible circuit assembly including the flexible circuit, the substrate and the capacitive-sensing device of FIG. 6A showing the configuration of the strain-relief structures of FIG. 6A, in accordance with embodiments of the present invention.

With reference now to FIG. 6B, in accordance with embodiments of the present invention, a plan view 600B of an assembled flexible circuit assembly 601 is shown that includes the flexible circuit 101, the substrate 205 and the capacitive-sensing device 207 of FIG. 6A. FIG. 6B shows the configuration of the strain-relief structures, for example, crinkles 126b, 126c and 126d, of FIG. 6A in the assembled flexible circuit assembly 601. As shown in FIG. 6B, the tabular extensions, for example, tabular extensions 124b, 124c and 124d, of the flexible circuit 101 are disposed on top of the conductive contact pads, for example, conductive contact pads 122b, 122c and 122d, respectively; and, the conductive contact pads, for example, conductive contact pads 122b, 122c and 122d, are disposed on top of the tabs, for example, tabs 224b, 224c and 224d, respectively. As shown in FIG. 6B, the traces of cutting planes 6E-6E, 6F-6F and 6G-6G are situated down the spines of the tabs and tabular extensions to illustrate the morphology of the interconnections between the conductive contact pads 122b, 122c and 122d of the flexible circuit 101 and the tabs, for example, tabs 224b, 224c and 224d, respectively, of the substrate 205. Cross-sectional elevation views of the configuration of the strain-relief structures along cutting planes 6E-6E, 6F-6F and 6G-6G are subsequently shown in FIGS. 6E-6G.

Figure 6C:
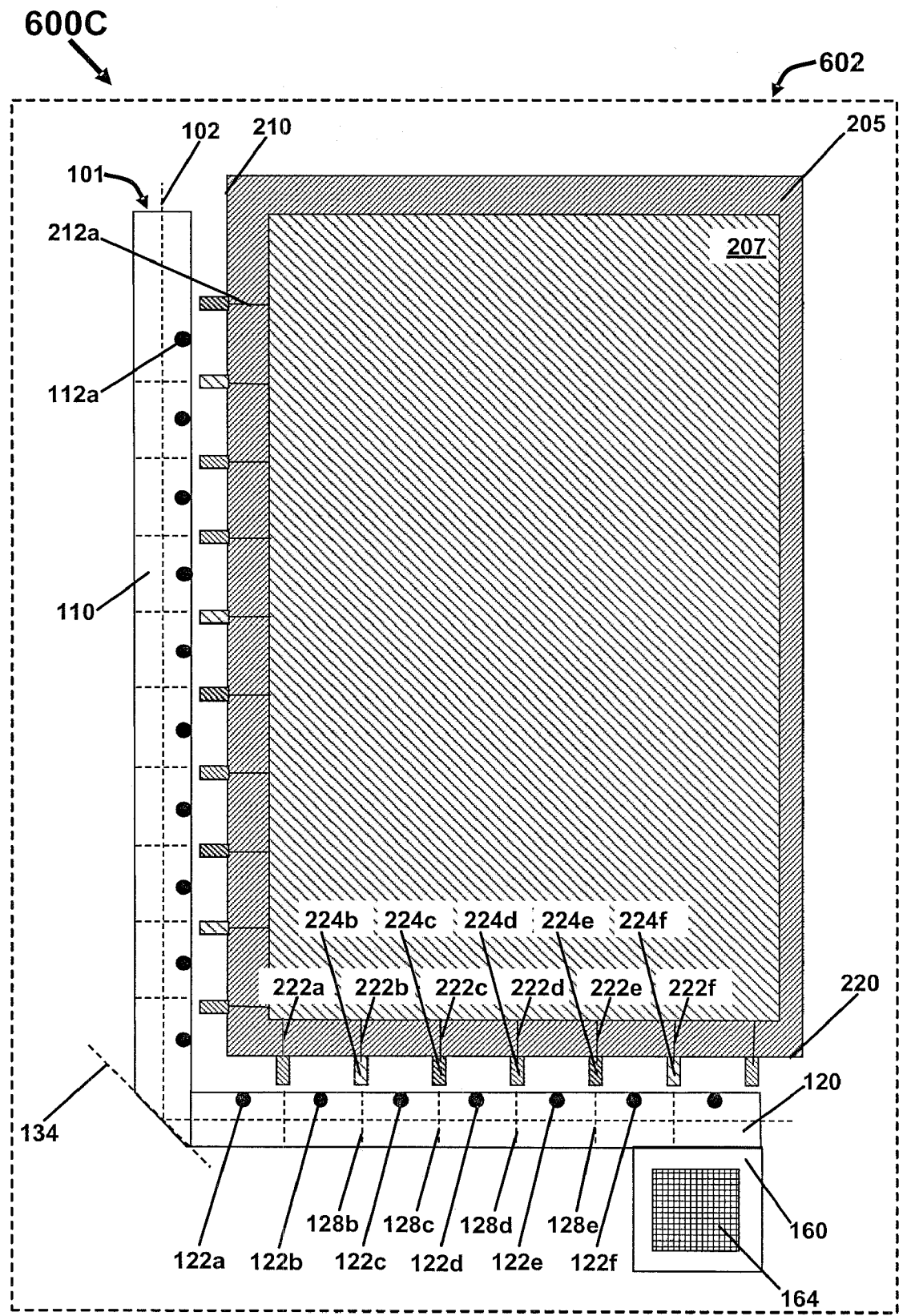
FIG. 6C is an exploded view of a flexible circuit, similar to the flexible circuit of FIG. 1, and a substrate of the capacitive-sensing device, similar to the substrate of FIG. 2, and alternative strain-relief structures configured to accommodate coupling to and to conform to tabs of the substrate of the capacitive-sensing device, in accordance with embodiments of the present invention.

With reference now to FIG. 6C, in accordance with embodiments of the present invention, an exploded view 600C of a flexible circuit assembly 602 and a substrate 205 of the capacitive-sensing device 207 are shown. Also, as depicted in FIG. 6C, the flexible circuit 101 of the flexible circuit assembly 602 includes alternative strain-relief structures, for example, crinkles 128b, 128c, 128d and 128e configured to accommodate coupling to and to conform to tabs, for example, tabs 224b, 224c, 224d, 224e and 224f of the substrate 205 of the capacitive-sensing device 207. Moreover, as shown in FIG. 6C, in an embodiment of the present invention, the flexible circuit 101 further includes at least one alternative strain-relief structure, for example, crinkles 128b, 128c, 128d and 128e. Strain-relief structures include crinkles, of which crinkle 128b is an example, that are disposed perpendicular to the second edge of the substrate midway between the conductive contact pads, for example, conductive contact pads 122b, 122c, 122d, 122e and 122f, of the flexible circuit 101. The conductive contact pads, for example, conductive contact pads 122b, 122c, 122d, 122e and 122f, are disposed to couple to the substrate 205 of the capacitive-sensing device 207. In an embodiment of the present invention, an alternative strain-relief structure, for example, one of crinkles 128b, 128c, 128d and 128e, is configured to accommodate coupling to and to conform to a tab, for example, one of tabs 224b, 224c, 224d, 224e and 224f, respectively, of the substrate 205 of the capacitive-sensing device 207.

With further reference to FIG. 6C, in accordance with embodiments of the present invention, the substrate 205 of the capacitive-sensing device 207 may include as many as three different levels of conductive layers that are patterned to provide the conductors of the substrate 205. The conductors, for example, conductors 222b, 222c, 222d, 222e and 222f, may be brought out at an edge, for example, second edge 220, of the substrate 205 in the form of tabs, for example, tabs 224b, 224c, 224d, 224e and 224f, respectively. As shown in FIGS. 6A, 6C, and 6E-6H, tabs at each of three different levels are shown with different cross-hatching, as previously described in the discussion of FIG. 6A. The crinkles 128b, 128c, 128d and 128e disposed midway between the conductive contact pads, for example, conductive contact pads 122b, 122c, 122d, 122e and 122f, of the flexible circuit 101 provide an offset of the flexible circuit 101 so as to minimize strain in coupling the conductive contact pads 122b, 122c, 122d, 122e and 122f, to the tabs 224b, 224c, 224d, 224e and 224f of the substrate 205.

Figure 6D:
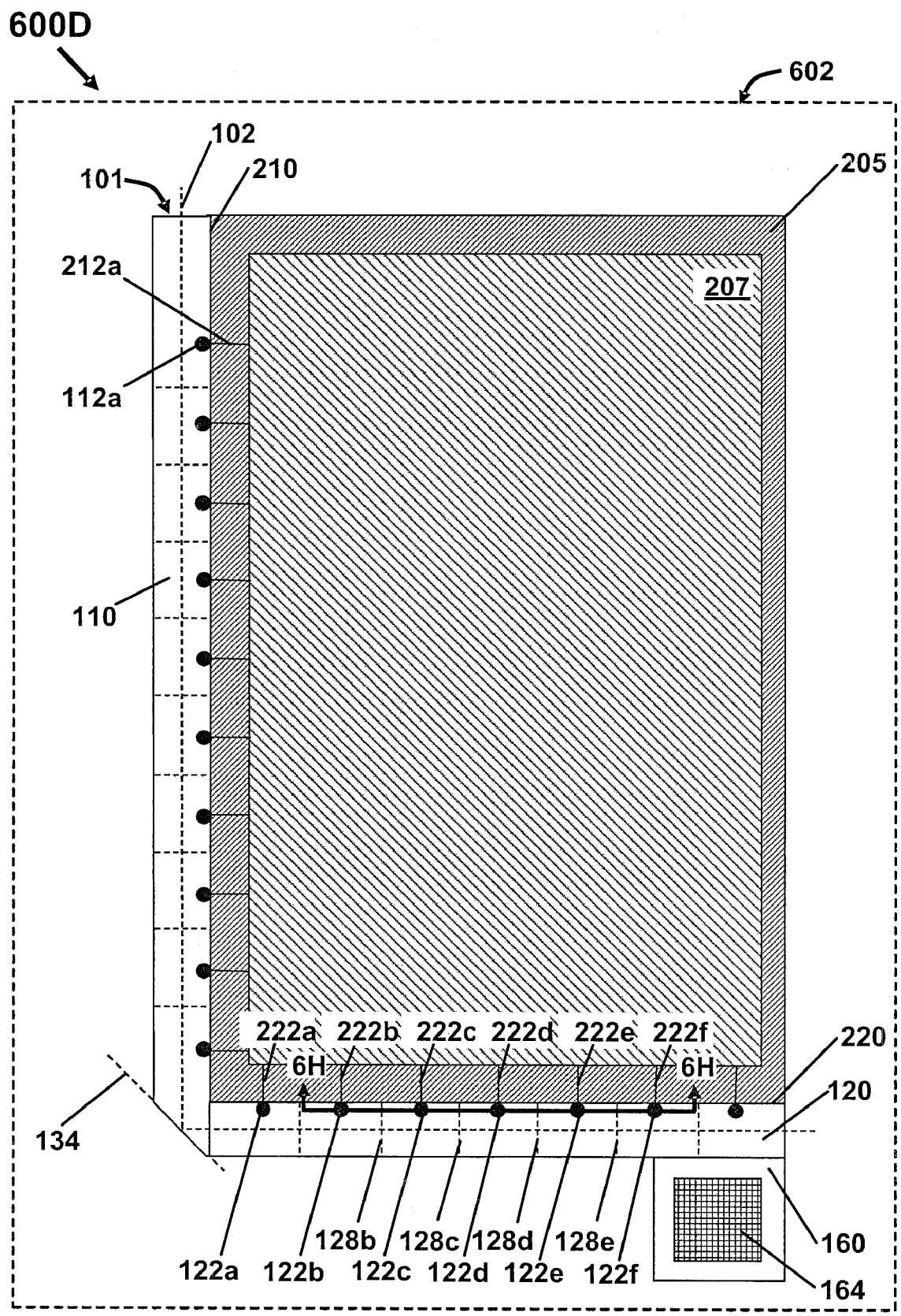
FIG. 6D is a plan view of an assembled flexible circuit assembly including the flexible circuit, the substrate and the capacitive-sensing device of FIG. 6C showing the configuration of the alternative strain-relief structures of FIG. 6C, in accordance with embodiments of the present invention.

With reference now to FIG. 6D, in accordance with embodiments of the present invention, a plan view 600D of an assembled flexible circuit assembly 602 is shown that includes the flexible circuit 101, the substrate 205 and the capacitive-sensing device 207 of FIG. 6C. FIG. 6D shows the configuration of alternative strain-relief structures, for example, crinkles 128b, 128c, 128d and 128e, of FIG. 6C in the assembled flexible circuit assembly 602. As shown in FIG. 6D, the conductive contact pads, for example, conductive contact pads 122b, 122c, 122d, 122e and 122f, are disposed on top of the tabs, for example, tabs 224b, 224c, 224d, 224e and 224f, respectively. As shown in FIG. 6D, the trace of cutting plane 6H-6H is situated perpendicular the spines of the tabs and parallel to the second edge of the substrate 205 to illustrate the morphology of the interconnections between the conductive contact pads 122b, 122c, 122d, 122e and 122f of the flexible circuit 101 and the tabs, for example, tabs 224b, 224c, 224d, 224e and 224f, respectively, of the substrate 205. A cross-sectional elevation view of the configuration of the strain-relief structures along cutting plane 6H-6H is subsequently shown in FIG. 6H.

Figure 6E:
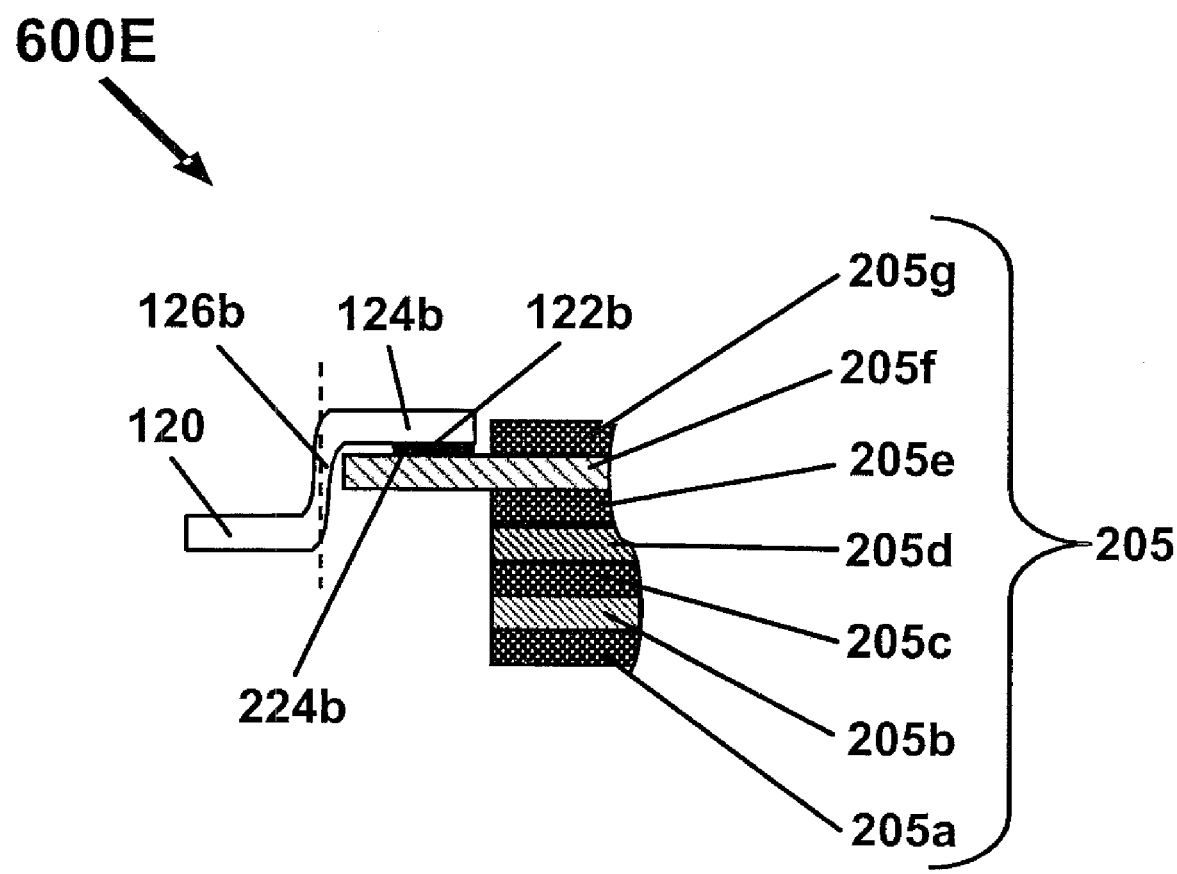
FIG. 6E is a cross-sectional elevation view of the configuration of the strain-relief structure along cutting plane 6E-6E, shown in FIG. 6B, configured to accommodate coupling to and to conform to a tab of a first electrical connection layer of the substrate, in accordance with embodiments of the present invention.

With reference now to FIG. 6E, in accordance with embodiments of the present invention, a cross-sectional elevation view 600E is shown of the configuration of the strain-relief structure, for example, crinkle 126b, along cutting plane 6E-6E, shown in FIG. 6B; the strain-relief structure, for example, crinkle 126b, is configured to accommodate coupling to and to conform to a tab, for example, tab 224b, of a first electrical connection layer 205f of the substrate 205. As shown in FIG. 6E, the substrate 205 includes electrically conductive layers 205b, 205d and 205f and electrically insulating layers 205a, 205c, 205e and 205g; the electrically conductive layers 205b, 205d and 205f are separated by electrically insulating layers 205c and 205e, respectively; and, electrically insulating layers 205a and 205g provide passivating and electrically insulating protection for the top and bottom electrically conductive layers 205e and 205b, respectively. An electrically conductive layer may include ITO; and, an electrically insulating layer may include PET, as previously described. A sensor substrate may have as many as three different levels of conductive layers that are patterned to provide the conductors, for example, conductors 222b, 222c, 222d, 222e and 222f, of the substrate 205. The conductors, for example, conductors 222b, 222c, 222d, 222e and 222f, may be brought out at an edge, for example, second edge 220, of the substrate 205 in the form of tabs, for example, tabs 224b, 224c, 224d, 224e and 224f, respectively. As shown in FIG. 6E, tab 224b couples to conductive contact pad 122b disposed at the bottom of the tabular extension 124b of the second portion 120 of flexible substrate 101. In an embodiment of the present invention, the strain-relief structure, which is crinkle 126b, is configured to accommodate coupling to and to conform to the tab 224b at the first, or top, conductive layer 205f of the substrate 205.

Figure 6F:
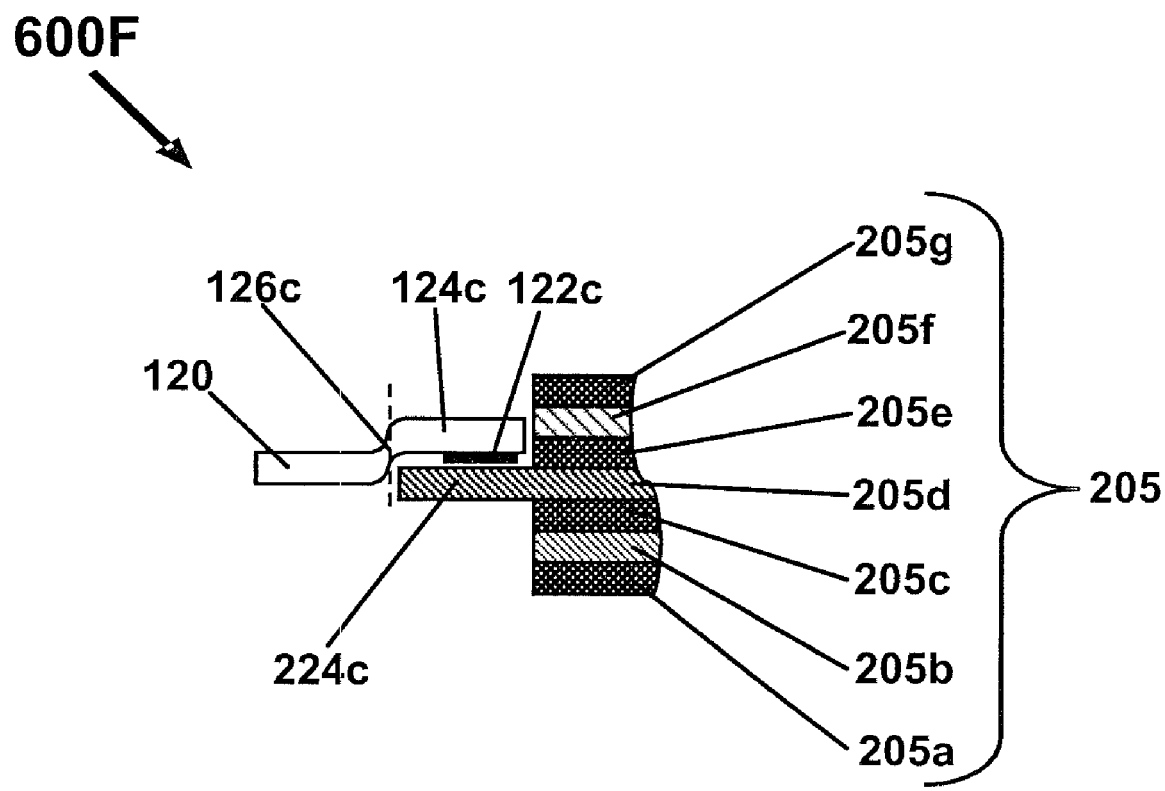
FIG. 6F is a cross-sectional elevation view of the configuration of the strain-relief structure along cutting plane 6F-6F, shown in FIG. 6B, configured to accommodate coupling to and to conform to a tab of a second electrical connection layer of the substrate, in accordance with embodiments of the present invention.

With reference now to FIG. 6F, in accordance with embodiments of the present invention, a cross-sectional elevation view 600F is shown of the configuration of the strain-relief structure, for example, crinkle 126c, along cutting plane 6F-6F, shown in FIG. 6B; the strain-relief structure, for example, crinkle 126c, is configured to accommodate coupling to and to conform to a tab, for example, tab 224c, of a second electrical connection layer 205d of the substrate 205. As shown in FIG. 6F, the substrate 205, includes electrically conductive layers 205b, 205d and 205f and electrically insulating layers 205a, 205c, 205e and 205g as described above in the discussion of FIG. 6E. The conductor 222c is brought out to the second edge 220 of the substrate 205 in the form of tab 224c. As shown in FIG. 6F, tab 224c couples to conductive contact pad 122c disposed at the bottom of the tabular extension 124c of the second portion 120 of flexible substrate 101. In an embodiment of the present invention, the strain-relief structure, which is crinkle 126c, is configured to accommodate coupling to and to conform to the tab 224c at the second, or middle, conductive layer 205d of the substrate 205.

Figure 6G:
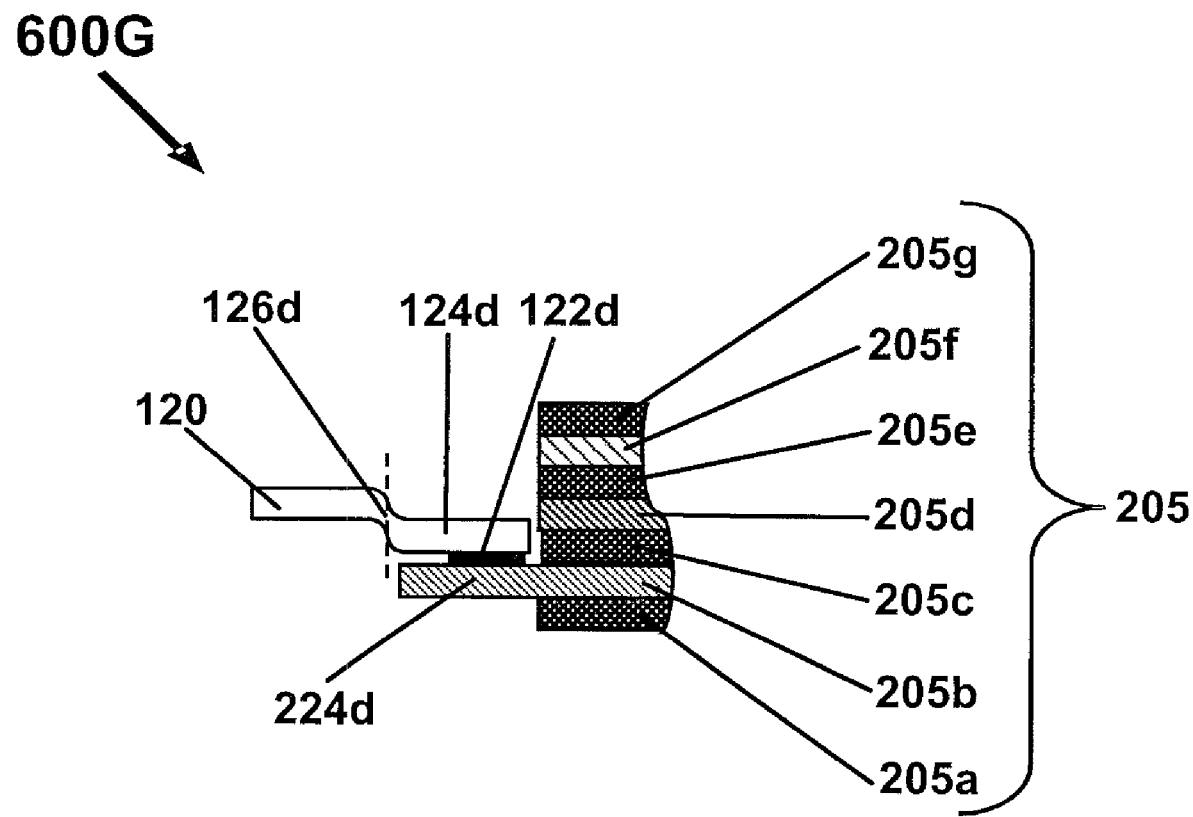
FIG. 6G is a cross-sectional elevation view of the configuration of the strain-relief structure along cutting plane 6G-6G, shown in FIG. 6B, configured to accommodate coupling to and to conform to a tab of a third electrical connection layer of the substrate, in accordance with embodiments of the present invention.

With reference now to FIG. 6G, in accordance with embodiments of the present invention, a cross-sectional elevation view 600G is shown of the configuration of the strain-relief structure, for example, crinkle 126d, along cutting plane 6G-6G, shown in FIG. 6B; the strain-relief structure, for example, crinkle 126d, is configured to accommodate coupling to and to conform to a tab, for example, tab 224d, of a third electrical connection layer 205b of the substrate 205. As shown in FIG. 6G, the substrate 205, includes electrically conductive layers 205b, 205d and 205f and electrically insulating layers 205a, 205c, 205e and 205g as described above in the discussion of FIG. 6E. The conductor 222d is brought out to the second edge 220 of the substrate 205 in the form of tab 224d. As shown in FIG. 6G, tab 224d couples to conductive contact pad 122d disposed at the bottom of the tabular extension 124d of the second portion 120 of flexible substrate 101. In an embodiment of the present invention, the strain-relief structure, which is crinkle 126d, is configured to accommodate coupling to and to conform to the tab 224d at the third, or bottom, conductive layer 205b of the substrate 205.

Figure 6H:
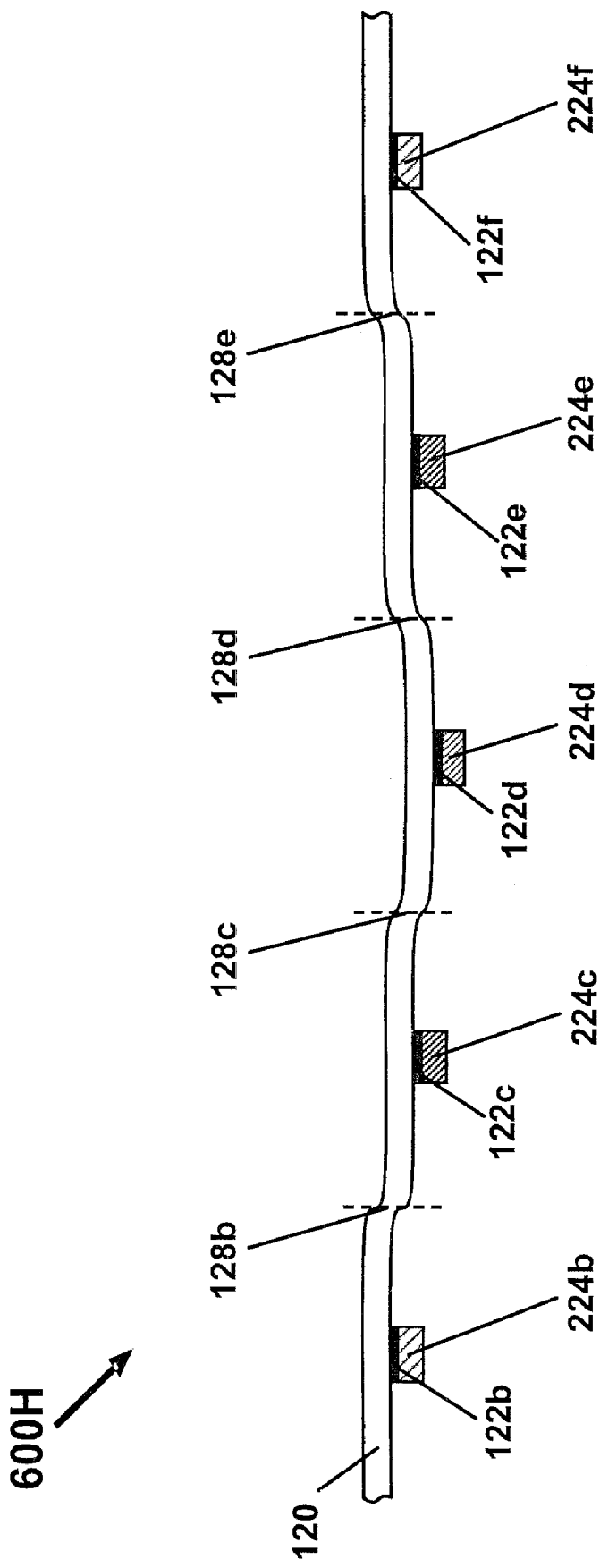
FIG. 6H is a cross-sectional elevation view of the configuration of the alternative strain-relief structure along section plane 6H-6H, shown in FIG. 6D, configured to accommodate coupling to and to conform to tabs of the first, the second and the third electrical connection layers of the substrate, in accordance with embodiments of the present invention.

With reference now to FIG. 6H, in accordance with embodiments of the present invention, a cross-sectional elevation view 600H is shown of the configuration of the strain-relief structures, for example, crinkles 128b, 128c, 128d and 128e, along cutting plane 6H-6H, shown in FIG. 6D; strain-relief structures, for example, crinkles 128b, 128c, 128d and 128e, are configured to accommodate coupling to and to conform to tabs, for example, tabs 224b, 224c, 224d, 224e and 224f, of electrical connection layers, for example, electrical connection layers 205b, 205d and 205f, of the substrate 205. The substrate 205, includes electrically conductive layers 205b, 205d and 205f and electrically insulating layers 205a, 205c, 205e and 205g as described above in the discussion of FIG. 6E. The conductors 222b, 222c, 222d, 222e and 222f are brought out to the second edge 220 of the substrate 205 in the form of tabs 224b, 224c, 224d, 224e and 224f, respectively. As shown in FIG. 6H, tabs 224b, 224c, 224d, 224e and 224f couple to conductive contact pads 122b, 122c, 122d, 122e and 122f, respectively, disposed at the bottom of the second portion 120 of flexible substrate 101. In an embodiment of the present invention, the strain-relief structures, which are crinkles 128c and 128d, are configured to accommodate coupling to and to conform to the tab 224d at the third, or bottom, conductive layer 205b of the substrate 205. Similarly, in an embodiment of the present invention, the strain-relief structures, which are crinkles 128d and 128e, are configured to accommodate coupling to and to conform to the tab 224e at the second, or middle, conductive layer 205d of the substrate 205; and, the strain-relief structures, which are crinkles 128c and 128b, are configured to accommodate coupling to and to conform to the tab 224c at the second, or middle, conductive layer 205d of the substrate 205. Moreover, in an embodiment of the present invention, the strain-relief structure, which is crinkle 128e, is configured to accommodate coupling to and to conform to the tab 224f at the first, or top, conductive layer 205f of the substrate 205; and, the strain-relief structure, which is crinkle 128b, is configured to accommodate coupling to and to conform to the tab 224b at the first, or top, conductive layer 205f of the substrate 205. As shown in FIGS. 6E-6H, embodiments of the present invention in which the conductive contact pads are disposed at the bottom of the flexible circuit 101 are by way of example without limitation thereto, as conductive contact pads that are disposed at the top of the flexible circuit 101 are also within the spirit and scope of embodiments of the present invention. It should also be appreciated that a typical sensor substrate may have more or less conductive or insulating layers than described herein.

Figure 7:
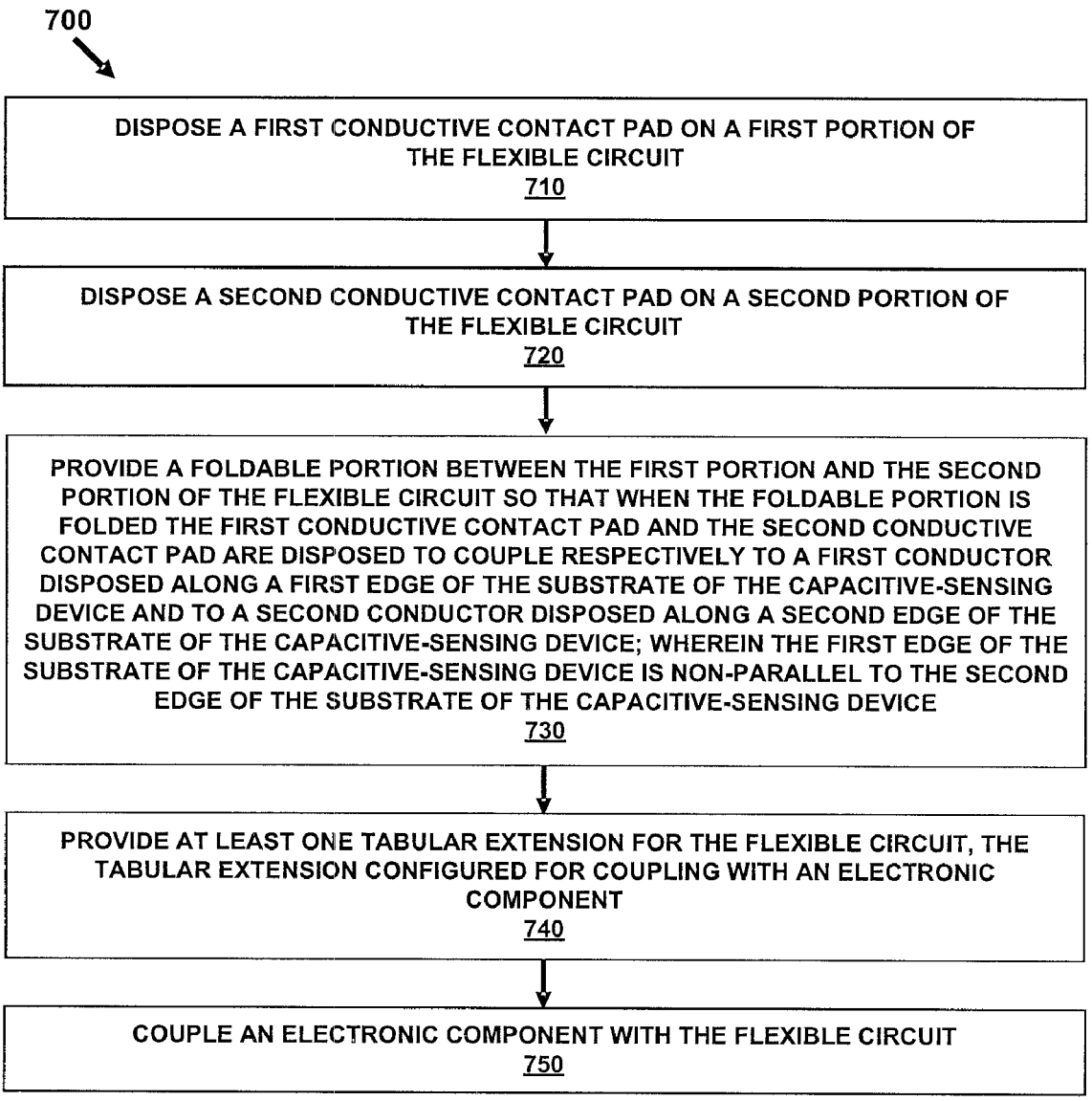
FIG. 7 is a flow chart of a method for making a flexible circuit for coupling to a substrate of a capacitive-sensing device, in accordance with embodiments of the present invention.

Description of Embodiments of the Present Invention for a Method for Making a Flexible Circuit for Coupling to a Substrate of a Capacitive-Sensing Device With reference now to FIG. 7, in accordance with an embodiment of the present invention, a flow chart 700 is shown. The flow chart 700 illustrates a method for making a flexible circuit for coupling to a substrate of a capacitive-sensing device. At 710, a first conductive contact pad is disposed on a first portion of the flexible circuit. At 720, a second conductive contact pad is disposed on a second portion of the flexible circuit. At 730, a foldable portion, which is a third portion, is provided between the first portion and the second portion of the flexible circuit so that when the foldable portion, which is the third portion, is folded the first conductive contact pad and the second conductive contact pad are disposed to couple respectively to a first conductor disposed along a first edge of the substrate of the capacitive-sensing device and to a second conductor disposed along a second edge of the substrate of the capacitive-sensing device. In accordance with embodiments of the present invention, the first edge of the substrate of the capacitive-sensing device is non-parallel to the second edge of the substrate of the capacitive-sensing device. At 740, at least one tabular extension is provided for the flexible circuit such that the tabular extension is configured for coupling with an electronic component. At 750, an electronic component is coupled with the flexible circuit.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A flexible circuit assembly, comprising:
   a flexible circuit comprising:
   a first portion having a first conductive contact pad;
   a second portion having a second conductive contact pad; and
   a third portion disposed between said first portion and said second portion;
   a substrate of a capacitive-sensing device, said substrate of said capacitive-sensing device coupled to said flexible circuit; and
   an electronic component, said electronic component coupled to said flexible circuit;
   wherein said flexible circuit is configured to fold upon itself at said third portion between said first portion and said second portion so that said first conductive contact pad couples to a first conductor disposed along a first edge of said substrate of said capacitive-sensing device and said second conductive contact pad couples to a second conductor disposed along a second edge of said substrate of said capacitive-sensing device, and wherein said first edge of said substrate of said capacitive-sensing device is non-parallel to said second edge of said substrate of said capacitive-sensing device.

2. The flexible circuit assembly of claim 1, wherein said electronic component is
   a controller, said controller coupled to said flexible circuit, wherein said controller is coupled to said capacitive-sensing device with said flexible circuit and is configured for providing control signals to said capacitive-sensing device.

3. The flexible circuit assembly of claim 1, further comprising:
   an adhesive disposed at said third portion, wherein a first surface of said first portion is adhered to a first surface of said second portion with said flexible circuit configured in a folded configuration.

4. The flexible circuit assembly of claim 1, further comprising:
   an adhesive disposed at said third portion, wherein a second surface of said first portion is adhered to a second surface of said second portion with said flexible circuit configured in a folded configuration.

5. The flexible circuit assembly of claim 1, further comprising:
   a stiffener disposed at a location where said electronic component couples to said flexible circuit, wherein said stiffener provides a stiff mechanical support to facilitate mechanical attachment of said electronic component to said flexible circuit.

6. The flexible circuit assembly of claim 1, further comprising:
   a fold-facilitation feature disposed at said third portion, wherein said fold-facilitation feature is selected from the group consisting of at least one indentation, a pattern of perforations, at least one notch, an area of lower modulus, an area of thinner material and a mark designating said third portion as a location for folding.

7. The flexible circuit assembly of claim 1, further comprising:
   a fourth portion including a third conductive contact pad, wherein said fourth portion is configured to fold at a fifth portion so that said third conductive contact pad couples to a third conductor disposed along a third edge of said substrate of said capacitive-sensing device.

8. The flexible circuit assembly of claim 1, wherein said flexible circuit further comprises:
   at least one strain-relief structure, said strain-relief structure configured to accommodate coupling to and to conform to a tab of said substrate of said capacitive-sensing device.

9. The flexible circuit assembly of claim 1, further comprising:
   said flexible circuit having at least one tabular extension, said tabular extension configured for coupling with a portion of the substrate of said capacitive-sensing device.

10. A flexible circuit, comprising:
    a first portion having a first conductive contact pad, and a first surface;
    a second portion having a second conductive contact pad, and a first surface wherein said first surface of said first portion and first surface of said second portion face substantially in the same direction when said flexible circuit is arranged in an unfolded configuration; and
    a third portion disposed between said first portion and said second portion;
    wherein said flexible circuit is configured to be folded upon itself at said third portion such that, when said flexible circuit is folded, said first surface of said first portion and first surface of said second portion face substantially in opposite directions, and said first conductive contact pad couples to a first conductor disposed along a first edge of a sensor substrate and said second conductive contact pad couples to a second conductor disposed along a second edge of an electronic device, and wherein said first edge of said sensor substrate is non-parallel to said second edge of said electronic device.

11. The flexible circuit of claim 10, wherein a sensor of said sensor substrate comprises a capacitive-sensing device and said electronic device comprises a display.

12. The flexible circuit of claim 10, wherein a sensor of said sensor substrate comprises a capacitive-sensing device and said electronic device comprises said capacitive-sensing device.

13. The flexible circuit of claim 10, wherein said second portion of said flexible circuit is a substantially rectilinear continuous extension of said first portion of said flexible circuit.

14. The flexible circuit of claim 10, further comprising:
    a plurality of fingers, wherein said plurality of fingers is configured to couple to two sides of a sensor substrate along one edge of said sensor substrate.

15. The flexible circuit of claim 10, wherein said third portion further comprises a folding axis, wherein said folding axis is disposed at an angle to a lengthwise axis of said flexible circuit in an unfolded configuration.

16. The flexible circuit of claim 10, wherein said first conductive contact pad is disposed on said first surface of said first portion and said second conductive contact pad is disposed on said first surface of said second portion.

17. The flexible circuit of claim 10, wherein said first portion has a second surface and said second portion has a second surface and wherein said first conductive contact pad and said second conductive pad are disposed on opposite facing surfaces of said first portion and said second portion when said flexible circuit is arranged in an unfolded configuration.

18. A method for making a flexible circuit for coupling to a substrate of a capacitive-sensing device, said method comprising:
- disposing a first conductive contact pad on a first portion of said flexible circuit;
- disposing a second conductive contact pad on a second portion of said flexible circuit; and
- providing a third portion between said first portion and said second portion of said flexible circuit so that when said third portion is folded upon itself said first conductive contact pad and said second conductive contact pad are disposed to couple respectively to a first conductor disposed along a first edge of said substrate of said capacitive-sensing device and to a second conductor disposed along a second edge of said substrate of said capacitive-sensing device;
- wherein said first edge of said substrate of said capacitive-sensing device is non-parallel to said second edge of said substrate of said capacitive-sensing device.

19. The method of claim 18, further comprising:
providing at least one tabular extension for said flexible circuit, said tabular extension configured for coupling with an electronic component.

20. The method of claim 19, further comprising:
coupling an electronic component with said flexible circuit.

* * * * *